(12) United States Patent
Wagner

(10) Patent No.: US 8,902,434 B2
(45) Date of Patent: *Dec. 2, 2014

(54) POSITION MEASURING DEVICE AND METHOD FOR DETERMINING AN ABSOLUTE POSITION

(75) Inventor: Jean-Jacques Wagner, Mauren (LI)

(73) Assignee: Elesta Relays GmbH (CH)

( * ) Notice: Subject to any disclaimer, the term of this patent is extended or adjusted under 35 U.S.C. 154(b) by 0 days.

This patent is subject to a terminal disclaimer.

(21) Appl. No.: 13/817,774

(22) PCT Filed: Aug. 19, 2011

(86) PCT No.: PCT/CH2011/000186
§ 371 (c)(1),
(2), (4) Date: Feb. 19, 2013

(87) PCT Pub. No.: WO2012/022001
PCT Pub. Date: Feb. 23, 2012

(65) Prior Publication Data
US 2013/0148131 A1    Jun. 13, 2013

(30) Foreign Application Priority Data

Aug. 19, 2010   (CH) .................................. 1341/10
Aug. 19, 2010   (CH) .................................. 1342/10
Aug. 20, 2010   (CH) .................................. 1343/10

(51) Int. Cl.
*G01B 11/14*    (2006.01)
*G01D 5/347*    (2006.01)
(Continued)

(52) U.S. Cl.
CPC ............ *G01B 11/14* (2013.01); *G01D 5/34707* (2013.01); *G01D 5/3473* (2013.01); *H01L 31/1055* (2013.01); *G01D 5/24442* (2013.01); *G01D 5/347* (2013.01); *G01B 11/00* (2013.01); *H01L 31/0203* (2013.01); *B23Q 7/06* (2013.01)
USPC .......................................... 356/614; 356/620

(58) Field of Classification Search
CPC ..... B23Q 7/06; G01D 5/347; G01D 5/24442; G01D 5/34707; G01D 5/3473; G01D 5/34715; G01D 5/36; G01B 11/00; G01B 11/14; H01L 31/0203; H01L 31/1055
USPC ............ 356/614–624, 399–401; 33/707, 700, 33/706; 250/208.2; 341/13, 11, 31
See application file for complete search history.

(56) References Cited

U.S. PATENT DOCUMENTS 4,659,924 A    4/1987  Tokunaga
4,780,610 A    10/1988 Abe
(Continued)

FOREIGN PATENT DOCUMENTS

DE          3939353 A1    5/1991
DE          4216296 A1    11/1993
(Continued)

*Primary Examiner* — Tri T Ton
(74) *Attorney, Agent, or Firm* — Morriss O'Bryant Compagni, PC

(57) ABSTRACT

A position measuring apparatus with at least one material measure comprised of an optical structure of an arrangement of 3-D reflectors, at least one light receiver arranged at a distance from the material measure, a light source arranged at a distance from the material measure and at a distance from the light receiver, and at least one transparent substrate present between the material measure and the light receiver, wherein the light receiver is deposited directly on the transparent substrate, on the side of the substrate opposite the material measure in the form of a thin-film structure consisting of several layers arranged one above another. A supporting plate is provided with circuit-board conductors, on which the substrate is arranged, wherein the transparent substrate and the supporting plate are joined solidly together by a Flip-Chip assembly process.

13 Claims, 14 Drawing Sheets

(51) Int. Cl.
*H01L 31/105* (2006.01)
*G01D 5/244* (2006.01)
*G01B 11/00* (2006.01)
*H01L 31/0203* (2014.01)
*B23Q 7/06* (2006.01)

(56) References Cited

U.S. PATENT DOCUMENTS

| | | | |
|---|---|---|---|
| 4,810,892 | A | 3/1989 | Hermann |
| 5,129,725 | A * | 7/1992 | Ishizuka et al. ............... 356/617 |
| 6,963,064 | B2 | 11/2005 | Updegrave |
| 7,342,671 | B2 | 3/2008 | Ito |
| 2004/0246500 | A1 * | 12/2004 | Holzapfel et al. ............ 356/616 |
| 2005/0087683 | A1 | 4/2005 | Kawai et al. |
| 2006/0007541 | A1 | 1/2006 | Totzeck et al. |
| 2006/0208682 | A1 | 9/2006 | Bober |
| 2013/0155420 | A1 * | 6/2013 | Wagner ........................ 356/617 |

FOREIGN PATENT DOCUMENTS

| | | |
|---|---|---|
| DE | 19641929 A1 | 4/1998 |
| DE | 19643911 A1 | 5/1998 |
| DE | 19859669 A1 | 6/2000 |
| DE | 19859670 A1 | 6/2000 |
| DE | 10129334 A1 | 1/2002 |
| DE | 69715554 T2 | 5/2003 |
| DE | 10357654 A1 | 7/2005 |
| DE | 102004036903 A1 | 3/2006 |
| DE | 102007014781 B3 | 5/2008 |
| EP | 1041628 A2 | 10/2000 |
| EP | 1528367 A2 | 5/2005 |
| EP | 1788361 A2 | 5/2007 |
| EP | 2063231 A2 | 5/2009 |

* cited by examiner

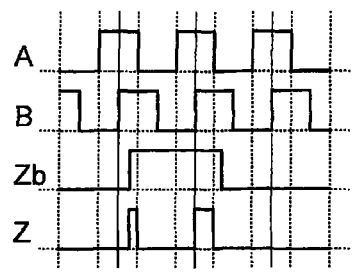
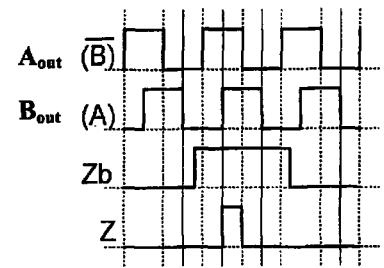
Fig. 13a  Fig. 13b
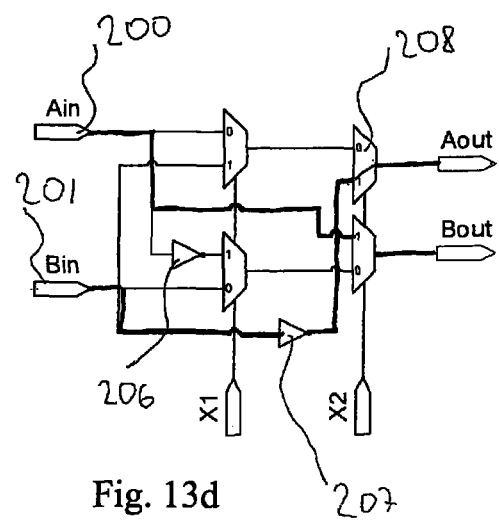
Fig. 13c  Fig. 13d

POSITION MEASURING DEVICE AND METHOD FOR DETERMINING AN ABSOLUTE POSITION

CROSS-REFERENCE TO RELATED APPLICATIONS

This application is a national phase entry under 35 U.S.C. §371 of PCT/CH2011/000186 filed Aug. 19, 2011, which claims priority to Swiss Patent Application No. 1342/10 filed Aug. 19, 2010, Swiss Patent Application No. 1341/10 filed Aug. 19, 2010, and Swiss Patent Application No. 1343/10 filed Aug. 20, 2010, the entirety of each of which is incorporated by this reference.

FIELD OF THE INVENTION

The invention relates to a position measuring device and a method for determining the absolute position of a moving.

PRIOR ART

A sensor head of a sensor operating with reflected light is known from US patent application No. 2006/0007541. This sensor head has a light source, which projects a light beam onto a material measure, and two semiconductor substrates. The semiconductor substrates each comprise photodetectors, for detecting light that is reflected by the material measure. Light source and semiconductor substrates are arranged in a box-like housing, wherein the light source is arranged and secured on the bottom of the housing and the semiconductor substrates are arranged and secured on the cover, with which the housing can be sealed. The semiconductor substrates are fastened by means of reversible assembly on the cover.

The semiconductor substrates with the photodetectors are arranged opposite one another on both sides of the light source in a direction that is perpendicular to the direction of motion of the material measure. Each semiconductor substrate has an electric circuit, and the electric circuits of the two semiconductor substrates are connected together by electric lines, which are formed on the underside of the cover. Current-voltage converters are formed directly on the semiconductor substrates, in order to keep interferences as small as possible.

A disadvantage of the known sensor head is that it is expensive to produce. First, the semiconductor substrates must be fabricated and then fastened to the housing cover. Then the light source is arranged and secured at the bottom of the housing. Finally, the cover is fitted on the housing in such a way that the light source is correctly oriented to the semiconductor substrate. This must be carried out with the necessary precision, so that with relative movement of the material measure, signals (in particular the analogue signals to be worked up by the sensor system) of adequate quality can be obtained, so that the encoder functions perfectly. Making the electrical connections to the two semiconductor substrates is also complicated and expensive. With such an arrangement, miniaturization of the sensor head cannot be achieved without loss of signal quality.

The device should be as compact as possible in its dimensions, so as to be suitable for the construction of small encoders. Despite the very compact design, it should still be able to make accurate determination of the absolute position (even in the position at rest) possible, which requires production of a qualitatively good basic signal.

Another aim of the present invention is to provide a position measuring device that is economical to manufacture. The design of the device should, moreover, make it insensitive to environmental influences. In addition, it should have a small power requirement, i.e. it should be suitable for operation with batteries.

SUMMARY OF THE INVENTION

By using a material measure with optical elements that make the total luminous energy incident on the individual graduations available for forming the basic signal, and through compact design of the sensor head, which creates short light paths between light source and light receiver, economical use of the luminous energy becomes possible.

The function of the sensor head is established by a lithography step, by which a light source and light receiver elements are formed on the glass substrate. In the FlipChip process the glass substrate is arranged on the supporting plate. The light receiver elements are connected via stud-bump and circuit-board conductors directly to a decoding circuit arranged on the back of the supporting plate.

In order to produce good basic signals, a special arrangement of the light receiver elements is provided. These are mounted end-to-end following the pattern A+b–a–B+. Careful layout of the light receivers is necessary for correct distribution of the centres of gravity of the light receiver elements. Moreover, the special shape provided plays a decisive role.

A compact design is made possible by using FlipChip assembly and other precautions. These are for example the choice of the metallic top layer of the light receiver elements, the use of stud-bumps for stable electrical connection (for a stable basic signal) and the use of an adhesive technology, wherein a rather unusual permanent resist permits secure adhesion. With this manner of construction, it is possible to work at low temperatures, which is gentle on the light receivers.

Owing to these precautions it is possible to construct a 3-channel absolute encoder with a diameter from 4 to 20 mm. Thanks to the optimum layout of the light paths, such an encoder can function with a power requirement of less than 3 or even 1 mA and achieve high resolutions at a reasonable price.

According to one aspect of the invention, the very small sensor head is mounted on a moving part, e.g. a lever, which makes it possible to determine the absolute position e.g. of a motor shaft in its position at rest.

Configurations of the position measuring device are described below, wherein the aforesaid features—provided they are not mutually exclusive—can be implemented in any combination.

Furthermore, a position measuring device (such as an encoder) has the following components:
a support,
a sensor head with a light source and a light receiver element arranged on the support,
a material measure with optical elements that is movable relative to the sensor head and can be mounted on a moving part of a device, for example a motor, and can interact with the sensor head for determining an absolute position value,
wherein the sensor head is arranged movably on the support, and means are provided for moving the sensor head relative to the support by a defined amount.

The movable arrangement of the sensor head on the support has the advantage that the absolute position of a moving element, e.g. of a shaft or of some other machine component, can be determined in its position at rest. Therefore when the machine is started, the absolute position of the machine component can be determined in a very short time, without requiring movement of the machine component itself, e.g. to reach a reference mark first. Furthermore, in combination with a compact sensor head described below, products can be developed that are much smaller and more economical than devices of this kind known from the prior art.

The position measuring device may be is characterised in that the displacing means for moving the sensor head is formed by a motor, which is linked mechanically to the sensor head.

Furthermore, it may be that the material measure is a rotary encoder.

An advantageous method is also to be disclosed for determining the absolute position of a moving element in the position at rest by means of a position measuring device, which enables the absolute position of the component to be determined by means of a material measure that is movable relative to a sensor head, and is coupled to the movable element, characterised in that,
for determining the absolute position of the movable element in the position at rest, the sensor head is displaced relative to the movable element.

According to an embodiment, it is a position measuring device with
at least one material measure with an optical structure, such as an arrangement of 3-D reflectors,
a light source arranged at a distance from the material measure and
at least one light receiver arranged at a distance from the material measure, and
at least one transparent substrate present between the material measure and the light receiver,
wherein on the side of the substrate turned away from the material measure, the light receiver is deposited directly on the transparent substrate in the form of a thin-film structure consisting of several layers arranged one above another,
wherein a light source is provided at a distance from the light receiver, and
wherein a supporting plate is provided, on which the substrate is arranged.

The light receiver thus has, advantageously, the form of a thin-film sensor. In the aforementioned layers, a recess is provided for a light source. The light source may be designed so that it can be made along with the processes for production of the sensors (light receiver elements), so that the dimensions and position of the light receivers and of the light source are predetermined by a lithography mask. Moreover, the light source can be formed by a diaphragm and an LED or by an OLED deposited directly on the substrate. In contrast to the prior art described at the beginning, therefore no further adjustment operations are necessary, which greatly simplifies the production of the position measuring device, but also makes it more reliable.

The light source may be arranged behind a recess or diaphragm etched out of the aforementioned layers.

Furthermore, a decoding circuit can be provided, which is arranged on the supporting plate.

The supporting plate may have circuit-board conductors on both faces, on the one hand for contacting with the light receiver and on the other hand for contacting a decoding circuit. Furthermore, it is advantageous if the supporting plate has terminals for connecting the position measuring device to an external display.

The transparent substrate and the supporting plate are advantageously firmly joined together by Flip-Chip assembly.

According to another advantageous embodiment, the light receiver is in contact with a metallic covering layer, such as aluminium. The electrically conducting metal may be aluminium, which may be alloyed with 1 to 5% titanium. Furthermore, it is desirable if the electrical connection between the conducting covering layer and the circuit-board conductors of the supporting plate is made by means of solder globules, so-called "bumps" or "stud-bumps". The connection between the metallic covering layer or the bumps on the one hand and the supporting plate on the other hand may be produced by means of an electrically conducting adhesive.

According to another variant of the invention, a permanent resist is provided between the supporting plate and the substrate for delimiting the spread of the adhesive.

According to an embodiment, the thin-film sensor is formed by
a transparent conducting layer, such as a transparent conducting oxide layer (=TCO layer),
a first doped layer,
an intrinsic layer, such as an amorphous silicon layer,
a second doped layer and
an electrically conducting, metallic covering layer,
wherein the layers may be present in the order stated. Advantageously, for producing a structured sensor zone, the aluminium layer, the uppermost doped layer and at least one part of the intrinsic layer may be etched away regionally.

The device according to the invention can also be characterised in that the light receiver is formed as a sensor zone consisting in each case of a plurality of light receiver elements, which are connected together electrically. Advantageously, in the device at least one first and one second sensor zone are provided, said zones being assigned to a material measure with an incremental track and an index track or an absolute track.

The first sensor zone may have first and second light receiver elements, which are interlocking. Furthermore it may be advantageous if the first and second light receiver elements are roughly U-shaped. The geometric centre of gravity of the first and second light receiver elements of the first sensor zone should be roughly on a straight line. It can also be envisaged that the first sensor zone is in each case formed by a plurality of strip-shaped light receiver elements, said light receiver elements being arranged at an angle of between 0.5 and 15 degrees to one another and one after another in a specified direction. The even and the odd (with respect to their sequence) light receiver elements can in each case be connected together electrically-conducting. According to another configuration of the device, the first and/or the second light receiver elements are connected together by an additionally applied electrically-conducting layer, wherein an insulating layer is provided between the metal layer and the additional, conducting layer. The first and second light receiver elements of the first sensor zone may be arranged so that two alternating signals, displaced by 180 degrees, are obtained in the order "AbaB".

The aforesaid device can be further characterised in that the second sensor zone is provided for the production of an index, and a strip-shaped, first light receiver element and two second light receiver elements, positioned at an angle from the first light receiver element, are formed. The geometric centre of gravity of the surface of the first light receiver element and of the surface of the two second light receiver elements of the second sensor zone advantageously essentially coincide. According to another configuration of the device according to the invention, the material measure has two tracks with optical elements, wherein a first track serves for producing an incremental signal and the second track serves for determining a position number or an index signal.

Some features relating to the light source, which can be implemented individually or in combination, are as follows: the light source can be arranged behind the substrate. In addition it is advantageous if the light source is an LED. Furthermore, the light source can be arranged essentially in the same plane as the light receiver. The light source, such as an OLED, is formed directly on the substrate between the light receivers. According to another configuration the light source is embedded in a metallic layer, so that scattered light can be kept out. There can also be an air gap in the light path between light source and substrate.

According to another advantageous embodiment of the present invention, the decoding circuit is arranged on the other side (i.e. on the side opposite to the light receivers and/or the light source) of the supporting plate in the form of an integrated circuit for processing the light receiver signals (such as in the Flip-Chip process), wherein the light receivers are connected electrically to the integrated circuit.

The aforementioned supporting plate consists of ceramic or of plastic (e.g. polyimide). According to another variant the supporting plate can be made of plastic film, such as polyimide film.

A method of producing a sensor head for a position measuring device can be particularly advantageous when it has the following process steps:

a) applying a large number of groups of light receivers on a transparent substrate in a thin-film process, said groups of light receivers serving in each case for the production of a single sensor head, b) providing in each case a diaphragm for a group of light receivers, c) applying contact points on the light receiver, such as in the form of spheres, so-called "bumps" or "stud bumps", which are made of solder or better still of gold, and can be applied by an electrolysis process (e.g. directly on bare Al-pads), d) providing a supporting plate with circuit-board conductors or contact points, which correspond to the contact points of the light receivers, and e) joining the glass substrate and the supporting plate together using an electrically conducting adhesive.

The contact points can also be applied in the form of gold spheres, so-called "stud-bumps", or in the form of gold deposits or gold/nickel deposits.

A non-electrically-conducting layer, which has recesses that correspond to the contact points of the light receivers, can be applied on the supporting plate beforehand. The recesses can then be filled at least partially with the electrically conducting adhesive.

A decoding circuit can be applied on the back of the supporting plate.

Furthermore, it is advantageous if some of the spaces present between glass substrate and supporting plate are filled with an underfill.

The material measure may be a rotary encoder or a rotary encoder is provided, which has a stated material measure.

Furthermore, a position measuring device has—especially in combination with one or more of the aforementioned features—the following components:

a housing, a sensor head arranged in the housing with a light source and a light receiver element, a rotatable encoder, which can be mounted on a shaft of a device, such as a motor, a reflective material measure with optical elements, provided at a distance from the sensor head, said material measure being arranged on the rotary encoder, wherein the material measure is arranged advantageously on the side of the rotary encoder that is opposite the housing.

The sensor head may be mounted on a printed-circuit board, which has a keyed connection to the housing, via a snap connection.

Furthermore, it is desirable for the position measuring device to have an adapter part, which has a first fastener for connecting to the device and a second fastener for keyed connection to the housing, wherein the second fastener is a snap connection, wherein the snap connection is formed by one or more projections on the adapter part and one or more recesses in the housing.

The housing advantageously has an assembly bearing, in which the rotary encoder and/or a seating for a shaft connected to the rotary encoder is mounted. The assembly bearing can be for example a ball bearing and especially a Teflon bearing.

The contacting of the sensor head takes place, according to an embodiment, via a lateral opening in the housing, wherein the opening is arranged on the side of the sensor head opposite to the rotary encoder. The contacting can take place via one or more cables, which pass through the opening, wherein they may be ribbon cables and especially a Flexprint.

Furthermore, it may be advantageous if the housing has a recess on the side, which connects to the opening, wherein the recess extends from the opening along the side up to another side or a rim or an edge of the housing and/or wherein the recess extends from the opening to the top side of the housing.

In another configuration variant the material measure has at least two tracks, wherein one track is an incremental track and wherein a second track is either an index track or a code track.

A position measuring device (such as an encoder) can—especially in combination with one or more of the stated features—have the following components:

a) a housing, b) a sensor head with one or more light receiver elements arranged in the housing, and c) a rotatable material measure with optical elements, provided at a distance from the sensor head. The material measure may be arranged on a rotary encoder, which can be mounted on a shaft of a motor or some other device.

The light receiver element is arranged in a defined or predetermined position relative to the optical elements and interacts with these to produce a signal. According to the invention, said defined position of the light receiver element relative to the optical elements is established by a sensor head holder, which has a keyed connection with the sensor head. The sensor head holder also has a keyed connection with the housing. Furthermore, the housing may be arranged in a defined position relative to the material measure and/or to the optical elements.

In this case the sensor head holder can be the support described above, on which the sensor head is arranged and which for the purpose of moving the sensor head is connected operatively with a motor.

The term "position" refers in this document to the distance and/or the orientation of the aforementioned part of the device, in particular relative to other parts of the device. The deviation from the defined positions is advantageously less than 0.2 mm, less than 0.1 mm or less than 0.05 or 0.02 mm.

This means that the corresponding parts of the device have been manufactured with the aforesaid accuracy.

According to an advantageous configuration, the position measuring device is characterised in that the light receiver element is arranged on a substrate, the edge of which has a keyed connection with the sensor head holder. Furthermore, the light receiver element may be applied on the substrate by a thin-film process. The substrate is advantageously a transparent substrate and may be a glass substrate.

When the light receiver element or the light receiver elements are applied on a substrate, the exact position of the light receiver elements relative to the edge of the substrate and therefore to a part of the sensor head can already be established in the production process. Light receiver elements can be applied particularly easily by thin-film processes. In this case a substrate board is provided with a large number of light receiver elements and is then divided into smaller units (substrates). This dividing can be carried out very accurately, e.g. by sawing the substrate board. This results in a defined position of the light receiver elements relative to the edge of the substrates, i.e. the place where the dividing took place.

It is advantageous if the sensor head holder has a first structural element, which has a keyed connection with the sensor head, wherein the first structural element is an opening. Furthermore, it is advantageous if the sensor head holder has a second structural element, which has a keyed connection with the housing, wherein the second structural element may be the edge of the sensor head holder. The first structural element is in this case advantageously arranged in a defined position relative to the second structural element. The first structural element can now have a keyed connection with the edge of the substrate.

This means that the position of the light receiver elements relative to the optical elements on the material measure may be established via several parts of the device that are matched to one another in their dimensions (substrate, sensor head holder, housing, material measure). The advantage is that there is no need for mechanical adjustment during assembly. The sensor head holder thus acts like an adapter. The sensor head holder can be made as part of the housing and/or of the cover described below. The sensor head holder is made as a separate part of the device, as this facilitates manufacture and assembly.

According to an advantageous embodiment of the invention, the sensor head holder is arranged between the material measure and a cover that seals the housing. The cover may be in contact with the sensor head holder and fixes it with respect to its position in the housing. An edge is provided inside the housing, to form a support for the sensor head holder, and if the sensor head holder is fixed between this support and the cover.

In a method of production of a position measuring device, a sensor head, which has one or more light receiver elements, has a keyed connection with a sensor head holder. The sensor head holder has a keyed connection with a housing. The sensor head holder is in this case introduced or inserted into the housing. The housing is arranged in a predetermined or defined position relative to a material measure, wherein the material measure is rotatable and has optical elements. In this case the housing, the sensor head holder and the sensor head have been or will be designed so that their keyed connection establishes a defined position of the light receiver element relative to the optical elements.

Furthermore, it may be advantageous if in said method
the light receiver element is applied on a substrate,
the edge of the substrate has a keyed connection with the sensor head holder, if the sensor head is connected to the sensor head holder,
the light receiver element is applied on the substrate by a thin-film process, and
the substrate is a transparent substrate and especially a glass substrate.

It may also be desirable if, in the aforementioned method
the sensor head holder is formed with a first structural element, which has a keyed connection with the sensor head, when the sensor head is connected to the sensor head holder, wherein the first structural element may be an opening (a through-hole), and
the sensor head holder is formed with a second structural element, which has a keyed connection with the housing, when the sensor head holder is connected to the housing, wherein the second structural element may be the edge of the sensor head holder, and
the first structural element is formed in a defined position relative to the second structural element.

Finally it is also desirable if, in the method
the sensor head holder is inserted in the housing at a distance from the material measure and has a keyed connection to the housing,
on the side of the sensor head holder opposite to the material measure, the housing is sealed with a cover, and
the cover may be brought in contact with the sensor head holder,
wherein the cover and/or the housing and/or the sensor head holder are separate parts of the device.

Owing to the compact design of the sensor head, it is possible to manufacture shaft encoders with further properties, for example position sensors with several sensor heads for the redundant acquisition of position values. Another possibility is to construct very compact absolute encoders, with a Manchester code or similar serial codes or a pseudorandom code incorporated in the material measure.

The aforesaid codes can for example be formed as binary codes. Through the concatenation of two optical elements that are differently oriented relative to their optical axis, and that interact with suitable receiver elements, two different states or signals can be produced. The aforesaid signals or states can be correlated with the increment signal. The determination of an absolute position value will be made possible by a relative movement between sensor head and material measure, in which the sequence of the optical elements is determined.

These advantageous properties are best achieved when the material measure is formed from semicircular-cylindrical reflectors and the light source has defined dimensions. This once again presupposes exact positioning of the light source above the light sensor, in order to obtain stable and reliable signals. The bundling of the total amount of light incident on a division of the material measure, together with the compact sensor head, make it possible to construct position determining units that have a high luminous efficiency and therefore a low power consumption, and ensure the function of the encoder with lower light output. The position measuring device according to the invention is therefore most suitable for use in battery-powered appliances.

The use of a thin-film structure with an intrinsic layer has the advantage that reliable light receivers can be produced with simple means owing to the presence of an interlayer that is insulating in itself. These layers have low dark currents and are particularly suitable for constructing a sensor head for an encoder that can operate with little current.

The aforesaid methods can also comprise, as process steps, the use of one or more of the aforesaid features of the device according to the invention (or the functions made possible by these features).

Advantages of configurations of the position measuring device described hereunder are:
- the possibility of manufacturing a position measuring device economically with the desired necessary precision,
- constructing a position measuring device with minimum dimensions, with high accuracy and reliability. This is advantageous especially in the medical area for optical examination instruments, in which for example a mirror must be positioned exactly.
- providing a position measuring device that tolerates a certain installation tolerance and nevertheless can ensure reliable operation and
- providing a position measuring device whose design is insensitive to environmental influences.

BRIEF DESCRIPTION OF THE DRAWINGS

The invention is explained in more detail on the basis of the drawings and a exemplary embodiment. The drawings show:

FIG. 13$a$ is a signal diagram showing signals A, B, Zb and Z.

FIG. 13$b$ is a signal diagram showing signals states $A_{out}$, $B_{out}$, Zb and Z.

FIG. 13$c$ is a table of signal combinations.

FIG. 13$d$ is a circuit for optimum assignment of the index signal Zb formed by the material measure;

DETAILED DESCRIPTION OF THE ILLUSTRATED EMBODIMENTS

Figure 1:
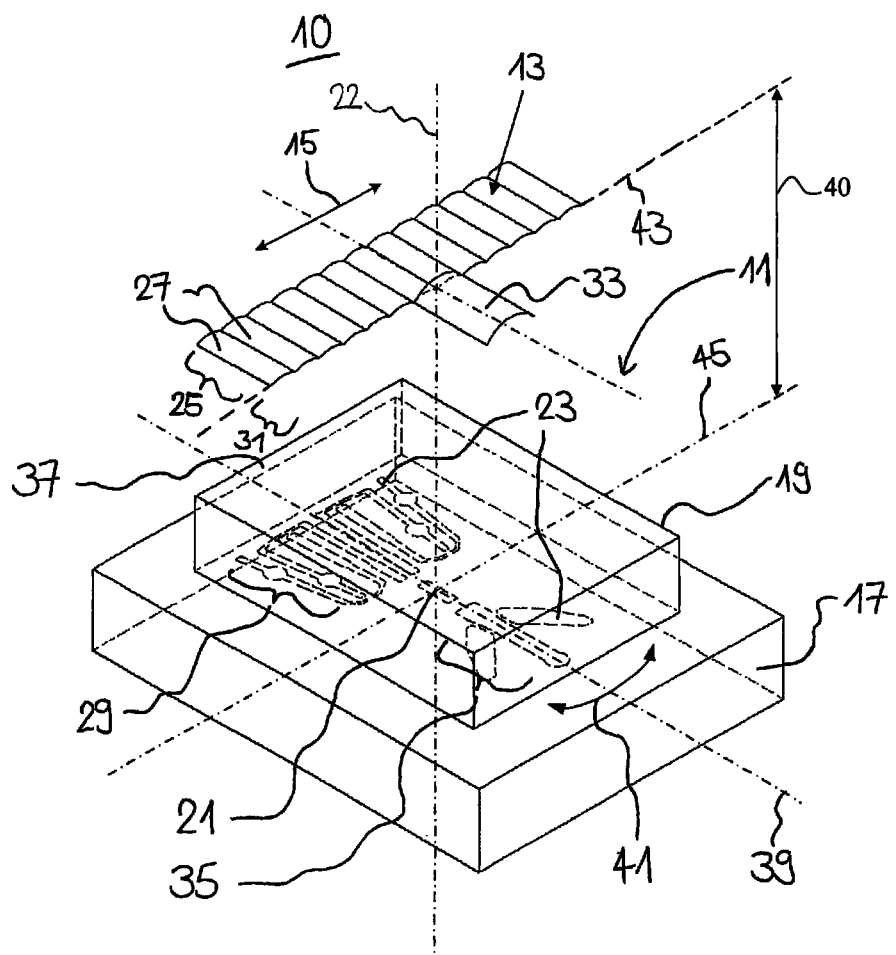
FIG. 1 schematically and in a perspective view, the design principle of an encoder, consisting of a sensor head according to the invention and a material measure located at a distance from the sensor head.

FIG. 1 shows an encoder 10 according to the invention comprising a sensor head 11 and a material measure 13, which is movable relative to the sensor head 11 in a direction 15. The first and second sensor zone 29, 35, which are at a distance 40 from the material measure 13, are arranged on the back of the sensor head 11. "Material measure" means, in the context of the present invention, a graduation or scale, which is mounted on a support or carrier and is suitable for reflecting and modulating a light beam, when the material measure is moved relative to the sensor head. This material measure can take the form of a circular rotary encoder or an oblong beam. The material measure itself has a division, wherein each division is suitable by definition for modulating a light beam, when the division is moved through the light beam. Structures are known, for example, in which for example one half of the division is transparent and the other half is opaque. Advantageously, each division is represented by a reflective optical element, which is suitable for bundling a light beam (e.g. hollow cylinder, hollow mirror). However, the use of grating structures is also conceivable, but their efficiency in light processing would be lower than that of mirrors, by which the light beam is deflected.

The sensor head 11 shown consists essentially of a supporting plate 17 and a transparent substrate 19, on the back of which, i.e. the side opposite the supporting plate 17, a light source 21 and light receiver elements 23 are arranged. The light source 21 emits a light beam, whose principal axis is designated with the reference number 22. A light source is used, which emits light in the visible region. For a better light signal with a smaller deflection, light with a wavelength below 630 nm, especially 580 and 630 nm, or below 460 nm would be advantageous. The material measure 13 contains at least one first track 25 with first optical elements 27, which interacts with a first sensor zone 29 of the material measure 13. Next to the first track 25, according to the exemplary embodiment shown, a second track 31 is provided, with at least one individual optical element 33. This second track 31 interacts with a second sensor zone 35 of the sensor head 11. As can be seen from FIG. 1, the optical elements 27 of the material measure are arranged in one plane, which is essentially parallel to the faces 37 of the substrate. Moreover, the material measure 13 is arranged relative to the substrate 19 in such a way that the tracks 25, 31 coincide, in each case in a direction parallel to the axis 22 of the light beam, with the sensor zones 29, 35.

The optical elements 27, 33 are formed as focusing lenses or mirrors, which in each case reflect incident light bundled onto the sensor head 11. According to the exemplary embodiment shown, the optical elements 27, 33 have the form of a circular semi-cylinder. The first track 25 serves for production of an incremental position signal, and the second track 31 for production of an index signal, as is described in more detail below (description for FIGS. 7 and 8).

The position of the material measure relative to the sensor head (especially the distance 40, cf. FIG. 1) is usually associated with an assembly tolerance, which has a direct influence on the quality and reliability of the measuring signal. With assembly tolerance of zero, the faces 37 of the substrate 19 are parallel to a plane passing through the material measure 13, and the direction of motion 15 (corresponds to a tangent to a circular path in the case of a material measure provided on a circular disk) runs at right angles to a longitudinal central axis 39, which divides the sensor zones 29, 35 and the light source 21 into two segments in each case. Deviations from the exact relative orientation of material measure 13 and substrate 19, which are indicated in FIG. 1 with arrow 41, can displace the position signals 104 from the two tracks 25 and 31 towards each other (see below, description for FIG. 10). At zero tolerance, the centre line 43 of the material measure will run essentially parallel to an axis 45 passing through the centre of the light source 21, provided the sensor zones 29, are arranged symmetrically to the centre of the light source. At zero tolerance of the distance between material measure 13 and sensor head 11, the nominal distance is mainly determined by the design of the optical elements 27, 33 of the material measure 13. In the context of the present invention, focusing optical elements and especially three-dimensional (3D) reflectors are especially advantageous, because these are particularly tolerant with respect to variation of the distance between material measure 13 and substrate 19.

With this arrangement, 3-channel encoders can be made with the width of a division from 18 μm to 150 μm. In the case of an encoder with a housing diameter of about 20 mm this corresponds for example to a number of marks on the rotary encoder from 360 to 3000 and in the case of an encoder with a housing diameter of about 6 mm this would correspond to a number of marks from 64 to 380 (a mark can be defined for example by an optical element or a division).

Figure 2:
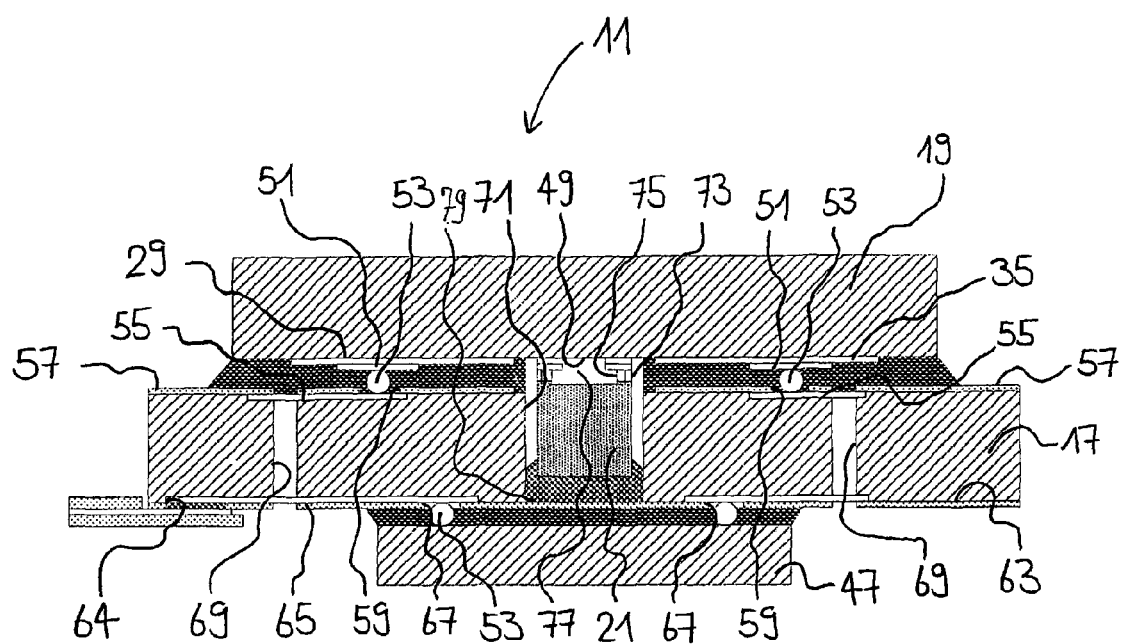
FIG. 2 schematically, the structure of the sensor head consisting of glass substrate with sensor zones formed thereon, a supporting plate and an evaluator, which are in each case joined together in the Flip-Chip assembly process.

According to FIG. 2, the sensor head 11 according to the invention comprises the substrate 19 with the first and second sensor zones 29, 35, the supporting plate 17 and an evaluator 47 mounted on the supporting plate 17. Substrate 19, supporting plate 17 and evaluator 47 are joined mechanically rigidly together by means of adhesive and underfill and sealed against the environment. The light source 21 is an LED, which is arranged behind a diaphragm, which defines the size of the light source. It is important for the present invention that the sensor zones 29, 35 are deposited directly on the substrate in a multistage thin layer process, by which the sensors and the diaphragm 49 are formed in one etching process. This method of production has the advantage that the relation between diaphragm 49 and sensor zones 29, 35 can be established very precisely, so that they can be formed in one etching stage according to FIG. 3b and FIG. 4b.

Electrical connection between the first and second sensor zones 29, 35 and the supporting plate 17 is provided by means of Flip-Chip assembly. So that the heat-sensitive sensor zones 29, 35 cannot be damaged during the production process—which could happen if "bumps" of solder were to be used—for the electrical contacts so-called "stud bumps" or ultrasonically applied gold spheres 53 are applied on the uppermost sensor zone 51 formed from aluminium (FIG. 3e). Once again, circuit-board conductors 55 are provided on the supporting plate 17. Above these circuit-board conductors 55, a film 57 is applied, which at the site of the planned electrical connection has recesses 59, which are filled with conductive adhesive 54 (FIG. 3e) before assembly. Substrate 19 and supporting plate 17 can now be joined together by means of Flip-Chip assembly. In the non-conducting layer 57, there are recesses 59 at the intended contact points. Various plastics, e.g. epoxy material, are suitable as film formers. After bonding, the space between supporting plate 17 and glass substrate 19 is filled with a so-called "underfill".

The decoding circuit 47, e.g. an ASIC, is arranged on the back 63 of the supporting plate 17. Connection of the decoding circuit 47 to the supporting plate 17 can also be effected by Flip-Chip assembly as with connection between the glass substrate 19 and the supporting plate 17. For this purpose, circuit-board conductors 64 and a non-conducting layer 65 with recesses 67 are applied on the back 63. The recesses 67 correspond to the contact points of the decoding circuit 47. These are filled with an electrically conducting adhesive before the supporting plate 17 and the decoding circuit 47 are joined together. The through-contacting from front to back takes place by means of openings 69 in the supporting plate 17, which are filled with a conducting material, e.g. solder or an electrically conducting adhesive.

As can be seen from FIG. 2, the light source 21, e.g. an LED, is housed in a recess 71 of the supporting plate 17. A spacer 75 keeps the light source 21 at a distance from the glass substrate 19, so that an air gap 77 is provided between the light opening and diaphragm 49. The air gap 77 serves for reducing the internal reflection present in the substrate 19, so as to achieve better utilization of the luminous energy. The back of the LED light source 21 can be contacted by means of an electrically conducting adhesive 79 (FIG. 4e).

In particular, the manner of production of the sensor zone and of the diaphragm 49 in thin-film technology is important for application of the present invention. In this, in a first step all layers that are required for constructing the sensor zones are deposited on a large area on a transparent substrate, a glass substrate (FIG. 3a). The size of the glass substrate is selected in such a way that a large number, in particular more than 200, more than 2,000 or more than 10,000 sensor arrangements can be fabricated simultaneously. Selection of substrate size depends on the available coating and etching devices.

In the manufacture of the light receivers, the following layers are applied successively on the glass substrate 19 (FIG. 3a), which produces the structure of a PIN diode:

1) a conducting transparent layer 81, a TCO (=transparent conducting oxide) layer, with a layer thickness between 10 and 100 nm, between 20 and 70 nm or between 25 and 50 nm.

2) a first n− or p+ doped layer 83 with a layer thickness between 10 and 80 nm, between 20 and 70 nm or between 25 and 50 nm.

3) an intrinsic layer 85 with a layer thickness between 100 and 1,500 nm, between 200 and 1,000 nm or between 400 and 800 nm.

4) a second p+ or n− doped layer 87 with a layer thickness between 10 and 80 nm, between 20 and 70 nm or between 25 and 50 nm and 5) a conducting top layer 51 with a layer thickness between 100 and 2,000 nm, between 500 and 1,500 nm or between 700 and 1,200 nm. In the region of the contact points 89, 91, or in the region of the pads 111 (cf. FIG. 10) the layer thickness is 1,000 nm.

The various layers are deposited by CVD (chemical vapour deposition), PECVD (plasma-enhanced chemical vapour deposition) or similar, modified processes such as VHFCVD or HWCWD. A plasma-enhanced chemical vapour deposition is comprised of silane, in order to produce an aSi:h (amorphous silicon) intrinsic layer. For doping the layers, the silane has an admixture of other gases, which contain the metals germanium (e.g. GeH) and/or boron (e.g. BH).

After the glass substrate has been coated with the aforementioned layers, the shape and extent of the light receiver elements and of the light source are defined, by applying a photoresist on the uppermost layer 51, exposing this to UV with a mask, and dissolving away either the unexposed or the exposed regions. Then in a first etching step, for example by ion beam etching on the places where the photoresist was dissolved away, the conducting covering layer 51, the second doped layer 87 and a part of the amorphous silicon layer 85 can be removed. As a result, the structure of the light receivers is already formed (FIG. 3*b*). Instead of amorphous silicon, similar materials could also be used, which can be used for forming a PIN diode.

Then in a further step, in certain places the TCO layer is laid bare, by completely etching away the amorphous silicon layer 85 and the first doped layer 83 essentially in a second etching step (ion beam etching and/or "reactive ion beam etching" (RIE)), or modified methods) (FIG. 3*c*). The procedure can be similar to the first etching process, i.e. the places that are not to be processed are masked first and then the non-masked places are processed. These process steps are very familiar to a person skilled in the art, so that there is no need to go into more detail here. The places that were laid bare form, after removal of the amorphous silicon layer, the one electrical contact point 89 of the light receiver. The other contact point 91 is formed by the conducting covering layer 51.

Figures 3, 4:
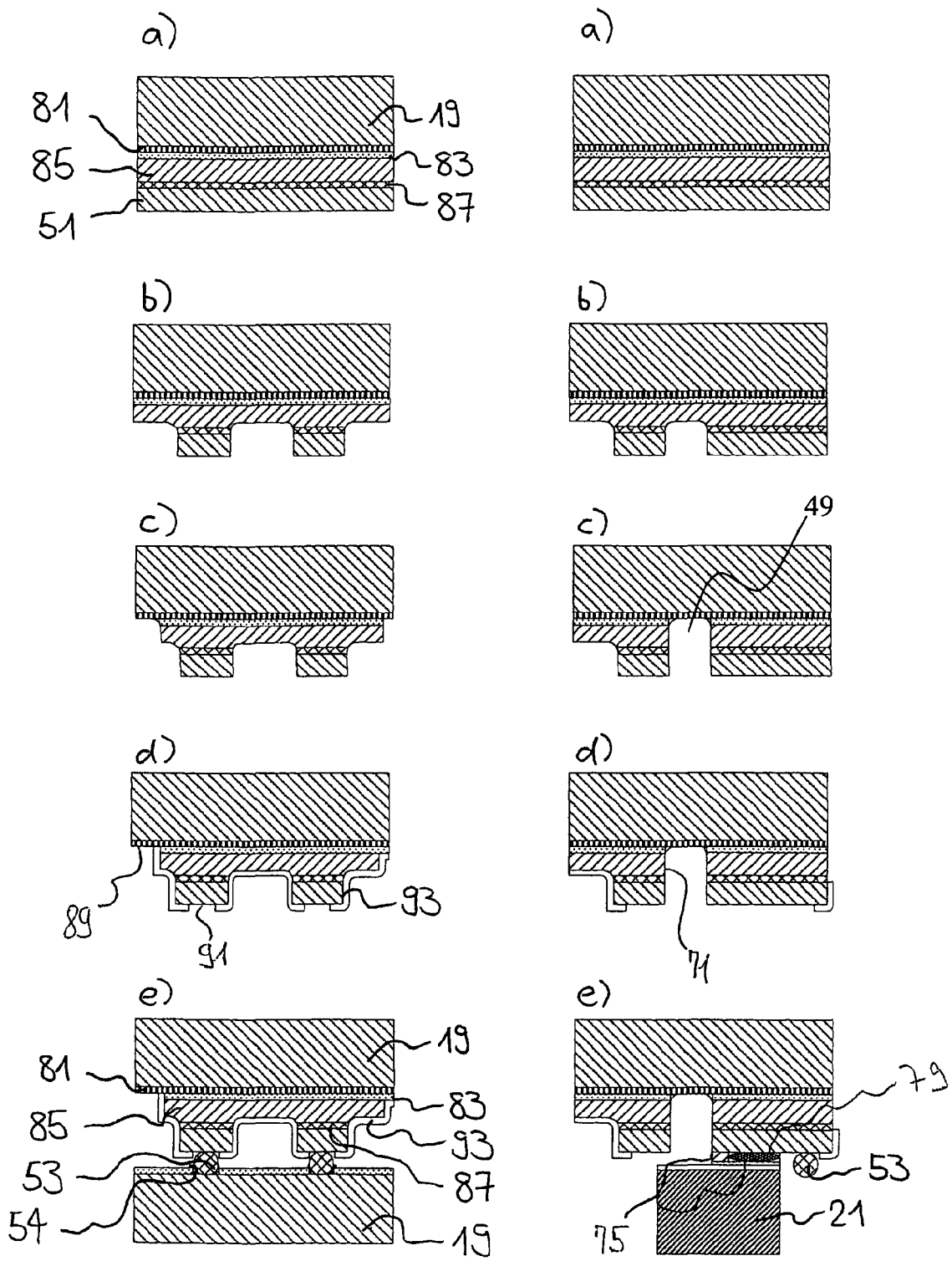
FIG. 3 the individual process steps for producing the sensor zones and contacting thereof.
FIG. 4 the individual process steps for constructing the light source.

Then the sensor zone is coated with a protective layer 93, an SiO$_2$ layer (FIG. 3*d*). The contact points 89, 91 are in each case recessed by etching or by the lift-off process. It should also be pointed out that FIGS. 3 and 4 serve exclusively for illustrating the production process and that the layer thicknesses shown do not coincide with the actual layer thicknesses.

As can be seen from FIG. 4, the diaphragm used in this exemplary embodiment for forming the light source can be produced by the same process steps as were used for producing the light receiver structures and the contacts. The light opening 49 is applied in the second etching step (FIG. 4*c*), in that a place that was already etched partially in the first etching process is etched further or completely. Through this light opening 49, the light can pass unhindered into the substrate 19. Any further (non-transparent) layers, such as the Al layer 51, also have an opening at the same place, so as not to prevent the light passing through. In this way a diaphragm is formed, which advantageously restricts the propagation of light from the LED 21, or defines the size or the dimensions of the light source.

Figure 12:
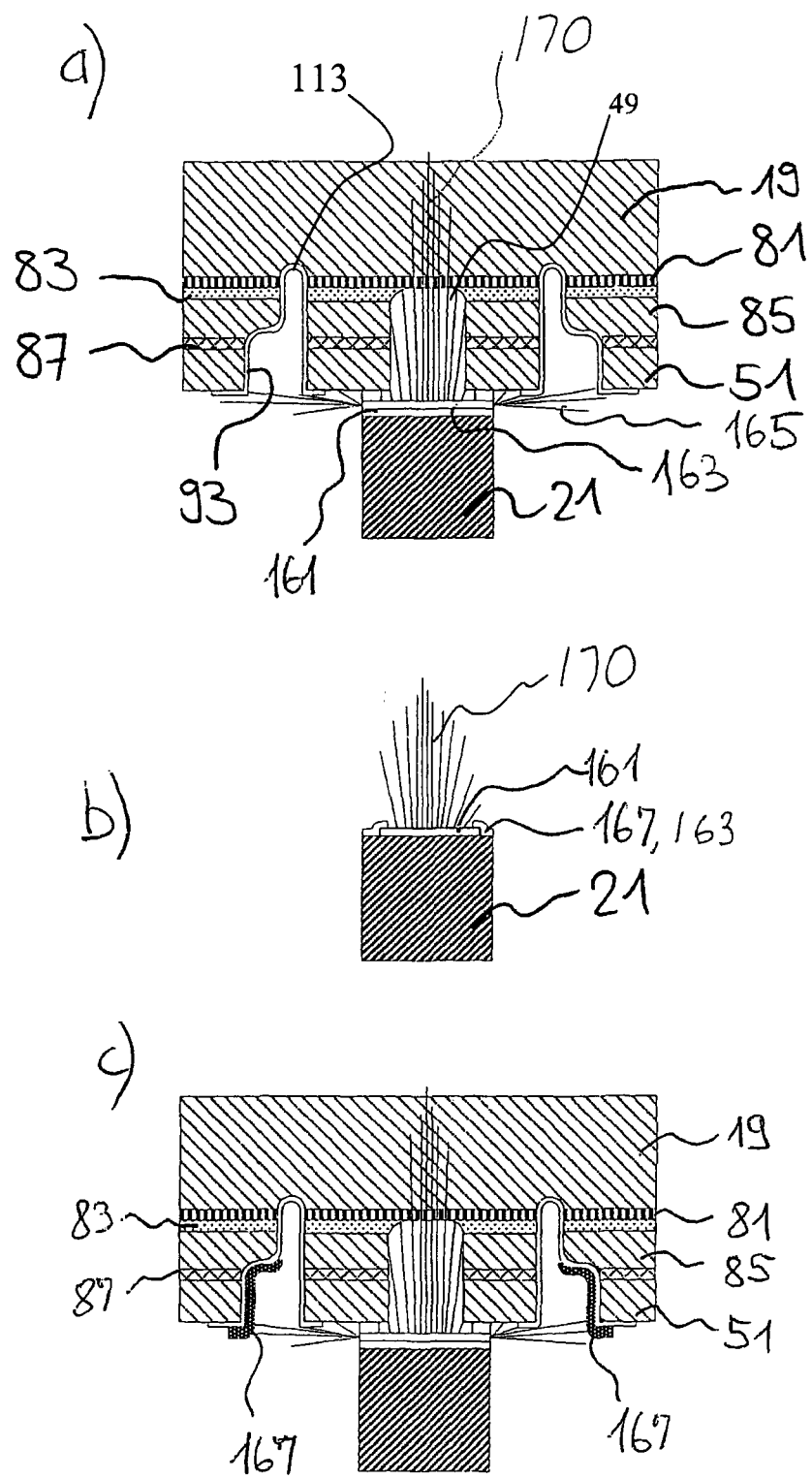
FIG. 12 an embodiment of the invention with a light source with an LED, which is arranged behind a diaphragm, wherein the diaphragm essentially determines the dimensions of the light source.

The LED can be glued onto the uppermost layer 51, by placing it on a spacer 75 (also see FIG. 12). The spacer 75 provides a defined gap between the substrate 19 and the light source 21. In this way a cavity is defined (reliably) for the adhesive 79. The spacer will be 4 to 50 μm high, 6 to 12 μm high, or formed from permanent resist.

Finally, the sensor zones and the supporting plate 17 are connected together electrically by Flip-Chip assembly. In the same process step, the front of the light source is contacted with the metal layer 51, in which circuit-board conductors, which are not shown in more detail, have been formed (contact point).

The thickness of the glass substrate 19 can be about 1 mm. The thickness is between 0.4 and 0.6 mm, wherein a glass substrate with a thickness of about 0.16 mm can be used for high-resolution encoders.

Figure 5:
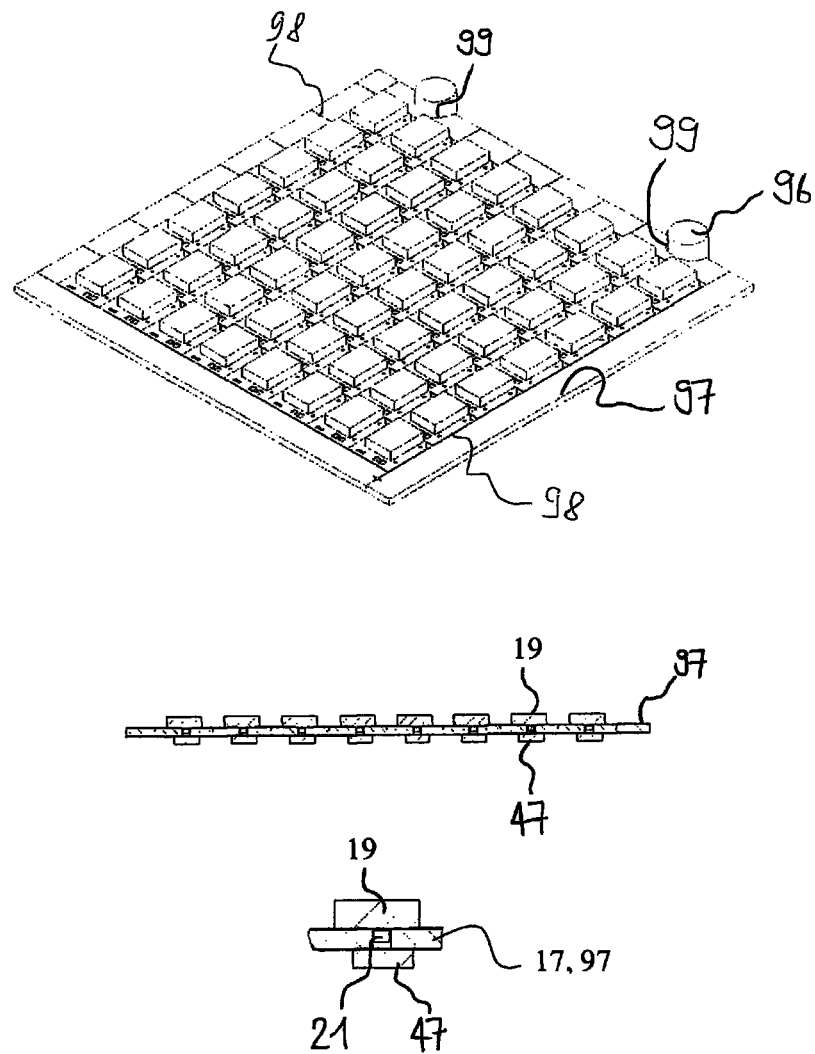
FIG. 5 schematically, assembly of the components on a wafer substrate.

FIG. 5 shows an arrangement of a large number of adjacently arranged sensor heads on a large supporting plate 97 in the form of a wafer. The diagram shows the substrates 19, which are fastened by Flip-Chip assembly on the carrier material 97. The carrier material is a board of electrically non-conducting material, on which, in a prior coating process, both on the front and on the back, circuit-board conductors were applied for contacting a large number of substrates 19 with light receivers and decoding circuits 47. The light sources 21 can be applied beforehand either directly, e.g. by gluing, on the glass substrate 19, or can be integrated in a recess of the carrier material 97. Then the decoding circuits 47 can be placed on the back of the carrier material 97. Assembly of the decoding circuit 47 can also take place in the Flip-Chip process. The substrate 19 with the light receiver elements 23 and the decoding circuit 47 can be connected simultaneously to the supporting plate 17. When the sensor heads 11 or the glass substrates 19 have been contacted with the decoding circuits 47, the encoder function can already be tested. This can take place in an automated process. Only after that, the carrier material 97, which is scribed (grooves 98), is broken up, sawn or separated by means of a grinding disk, into supporting plates 17. The carrier material is ceramic, especially black-coloured ceramic.

On a lateral edge of the carrier material 97, two recesses 99 are provided, in which pins 96 of a tool can engage. By means of the recesses 99 and corresponding tools, the carrier material 97 can be accurately aligned during the various process steps. This allows economical manufacture.

Figure 6:
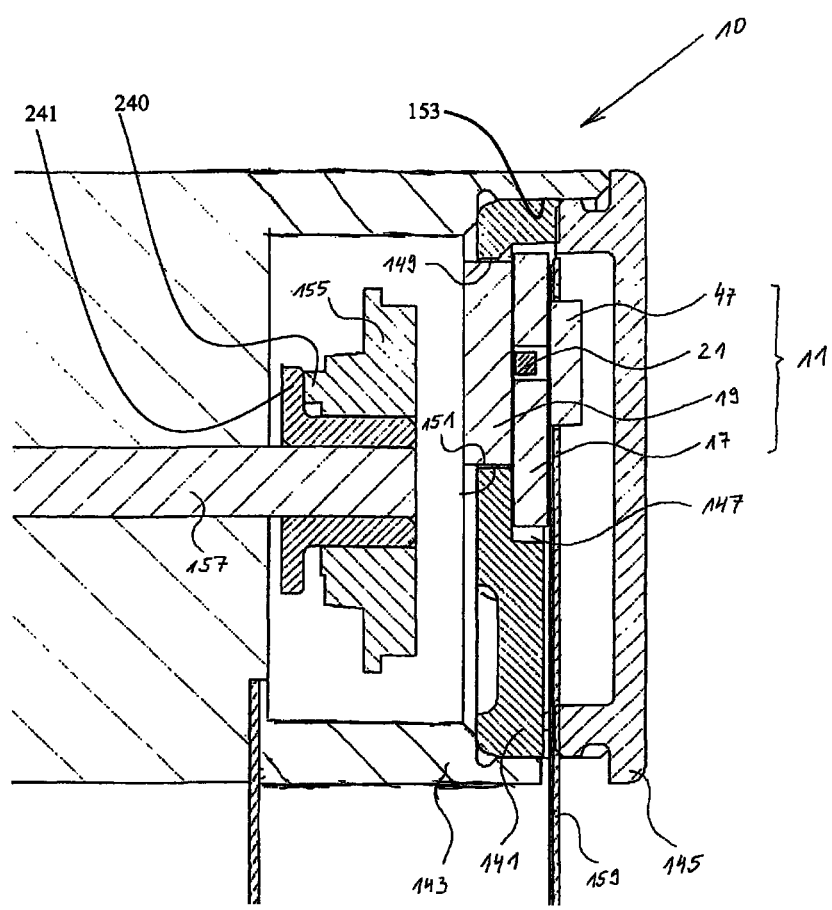
FIG. 6 in cross-section, a exemplary embodiment of an encoder arranged in a housing for small motors.

FIG. 6 shows an example of a miniature motor, on which, owing to the compact design of the sensor head, a high-quality sensor can be mounted. If, on the material measure, there is an absolute track according to FIG. 9 and an incremental track according to FIG. 7, an absolute encoder can be constructed in the same construction volume and the same construction. In this case a movement of less than about 2° is sufficient for the absolute position to be determined or to be read from the material measure by means of the sensor head. With encoders of the current state of the art (with an index mark), an angular motion of up to 360° is necessary for an absolute reference point to be found.

FIG. 6 shows an encoder 10 with a sensor head 11 and a rotary encoder 155, on the surface of which a material measure (not shown) is arranged. The rotary encoder 155 is connected to a shaft 157 and is therefore rotatable. The sensor head 11 and the material measure formed from optical elements (not shown) interact to produce a signal. For this, in this configuration the sensor head 11 has a light source 21, which emits light towards the material measure. The optical elements of the material measure are arranged on the side of the rotary encoder 155 opposite the sensor head 11. They reflect the light coming from the light source 21 in bundled form onto the sensor head 11, where it is recorded by the light receiver elements (not shown). Naturally, the light source can also be arranged on the other side of the rotary encoder 155 and can send the light via the optical elements to the sensor head 11. However, the solution is shown, in which the sensor head 11 has both one or more light sources and one or more light receiver elements. For correct formation of the position signals, the light receiver elements must be arranged in a defined position relative to the optical elements. Instead of adjusting the position of the light receiver elements relative to the material measure or to the housing directly with a tool and/or an optical device, as known from the prior art, in the encoder shown 10 this is achieved indirectly by matching the dimensions of the individual parts of the device with one another. The sensor head holder 141 has a first structural element in the form of an opening 149, into which a part of the sensor head 11 can be inserted with an accurate fit, so that a keyed connection is produced. This part of the sensor head 11 is advantageously a transparent substrate 19, onto which the light receiver elements are applied by thin-film processes. In these processes, a large number of light receiver elements are placed on one substrate board, which is then cut up into (smaller) substrates 19. Such a design of the sensor head 11 allows the position of the light receiver elements relative to the edges of the substrates to be determined by the accurate cutting of the substrate board. The edge 151 of the substrate 19 can interact as a keyed connection with the aforesaid opening 149 in the sensor head holder 141. The opening 149 is positioned accurately relative to a second structural element, which is in this case the edge 153 of the sensor head holder 141. The edge 153 of the sensor head holder 141 interacts as a keyed connection with the inside wall of the housing 143, wherein the housing 143 is once again arranged in a defined position relative to the material measure. This means that the position of the sensor head 11 or of the substrate 19 and therefore also the position of the light receiver elements relative to the optical elements on the material measure is established indirectly via several parts of the device, which are matched with one another in their dimensions. The advantage is that no mechanical adjustment is required during assembly. The sensor head holder 141 thus also acts as an adapter. Regarding the aforesaid dimensions or the defined positions, advantageously deviations of less than 0.2 mm, less than 0.05 mm are ensured, which is generally sufficient for correct functioning of the measuring device. The housing 143 is sealed with a cover 145, which presses against the sensor head holder 141 and thus fixes it in the housing 143. The housing 143 has, between cover 145 and housing 143, an opening, through which contacting of the sensor head 11 e.g. by means of cables 159, or by means of a Flexprint, can take place. This arrangement ensures simple assembly of the sensor head. According to the configuration variant of an encoder 10 shown in FIG. 6, an adapter for the rotary encoder 155 is provided on the shaft 157. The adapter has a seating for the shaft and a flange 241 extending from the shaft 157 radially outwards. The adapter has a hollow-cylindrical shaft support and an annular flange 241, protruding from the shaft support. The rotary encoder 155 is in contact with the side of the shaft support opposite the shaft 157 and with the flange 241 of the adapter, the rotary encoder has one or more feet 240, which in the assembled state of the encoder 10 come in contact with the flange 241. The rotary encoder 155 is fastened on the adapter with adhesive. This arrangement ensures simple assembly of the sensor head.

Figure 18:
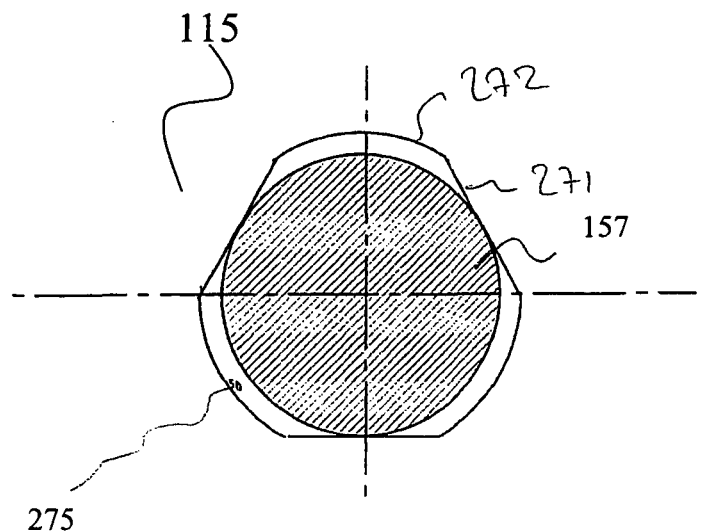
FIG. 18 a design of the shaft support.

The rotary encoder 155 is glued onto the shaft 157. The through-hole 272 in the rotary encoder is configured (cf. FIG. 18) so that one or more channels 275 (for example 2-20 or 3-10) are formed between the rotary encoder and the shaft 157, and become filled with adhesive. FIG. 18 shows one design of the through-hole 272 of a rotary encoder 155, wherein the rotary encoder has a keyed connection with the shaft 157 via flat regions 271. Correspondingly, those parts of the edges of the through-hole 272 that form the channels 275 are farther (in particular 0.02 to 0.2 mm farther) from the shaft, than those parts of the edges that form the flat regions 271. The latter are in contact with the shaft, i.e. the flat regions 271 represent the contact points between rotary encoder 155 and shaft 157. The channels 275 between rotary encoder and shaft 157 can be filled with adhesive. This arrangement is especially advantageous from the standpoint of the toolmaker, as it enables him to produce a tool for providing a through-hole 272 very easily. Said tool is advantageously made from a (circular-cylindrical) workpiece, which has a diameter that is 0.02 to 0.2 mm larger than the diameter of the shaft 157. The workpiece can be provided in several places e.g. by grinding, with flats or with flat sides, which form the flat regions 271 during production of the through-hole 272. According to a configuration variant, 1 to 10, especially 2 to 5 or 3 channels 275 are provided.

The rotary encoder and the material measure are formed from plastic, black-coloured plastic, for easier visual inspection. The material measure is then coated with a metal, such as gold or aluminium. However, an additional protective layer, e.g. $SiO_2$ or synthetic resin, can be applied on the aluminium layer.

An alternative embodiment envisages a film structure of the rotary encoder. A plastic can serve as the carrier material, on which an aluminium layer and a plastic film as oxidation protection of the aluminium layer are provided. The material measure can be formed by hot embossing on the side of the aluminium layer.

Figure 7:
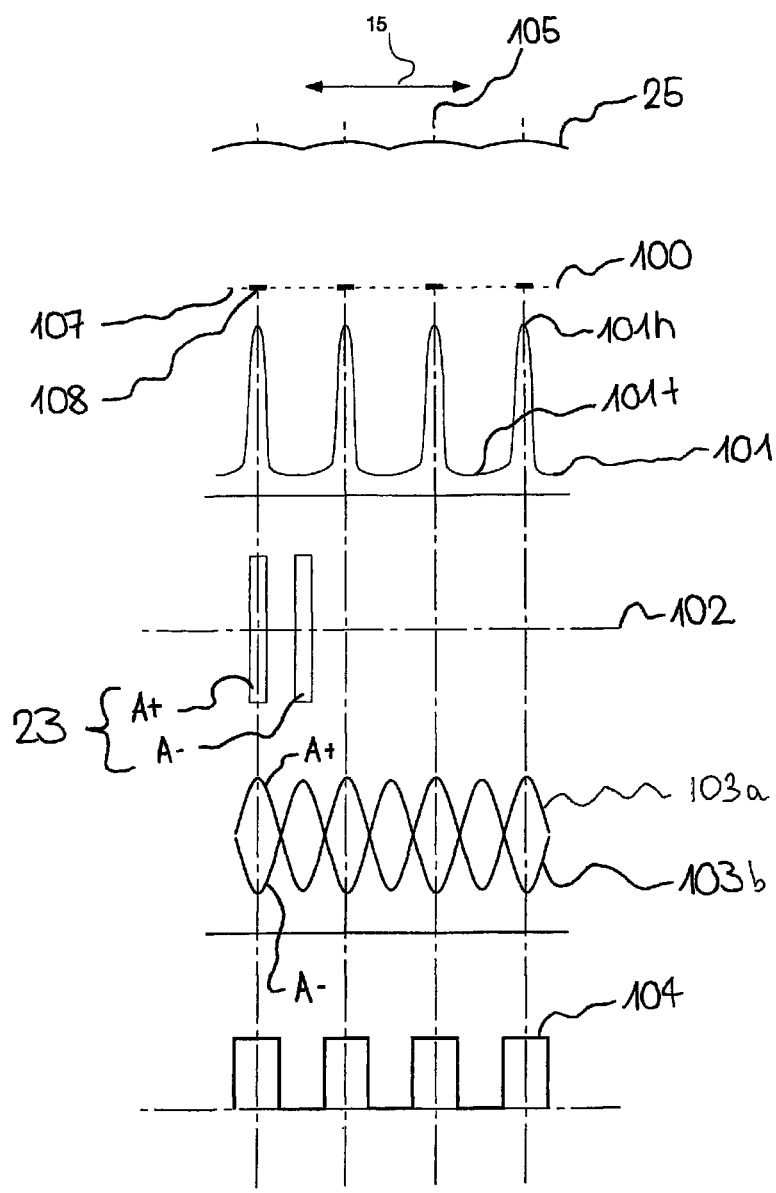
FIG. 7 schematically, how with relative movement of receiver element and material measure, the light intensities recorded by the receiver element are converted into an analogue signal and then to a digital signal for position determination.
Figure 8:
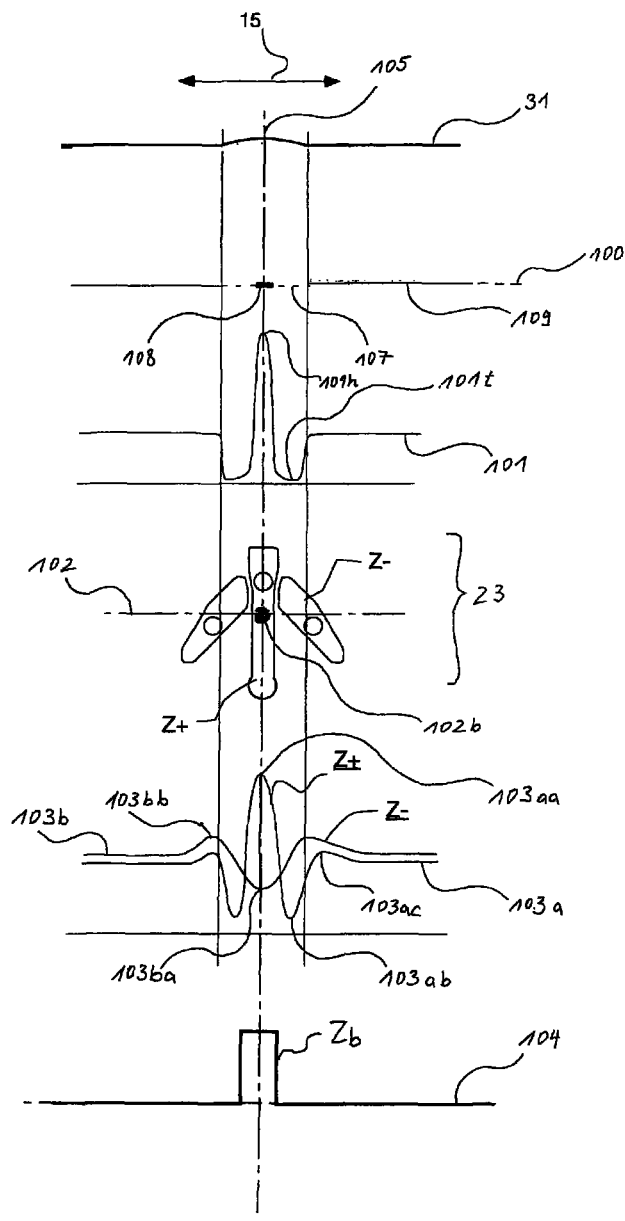
FIG. 8 schematically, the production of an index signal by means of a single optical element and two receiver elements.
Figure 9:
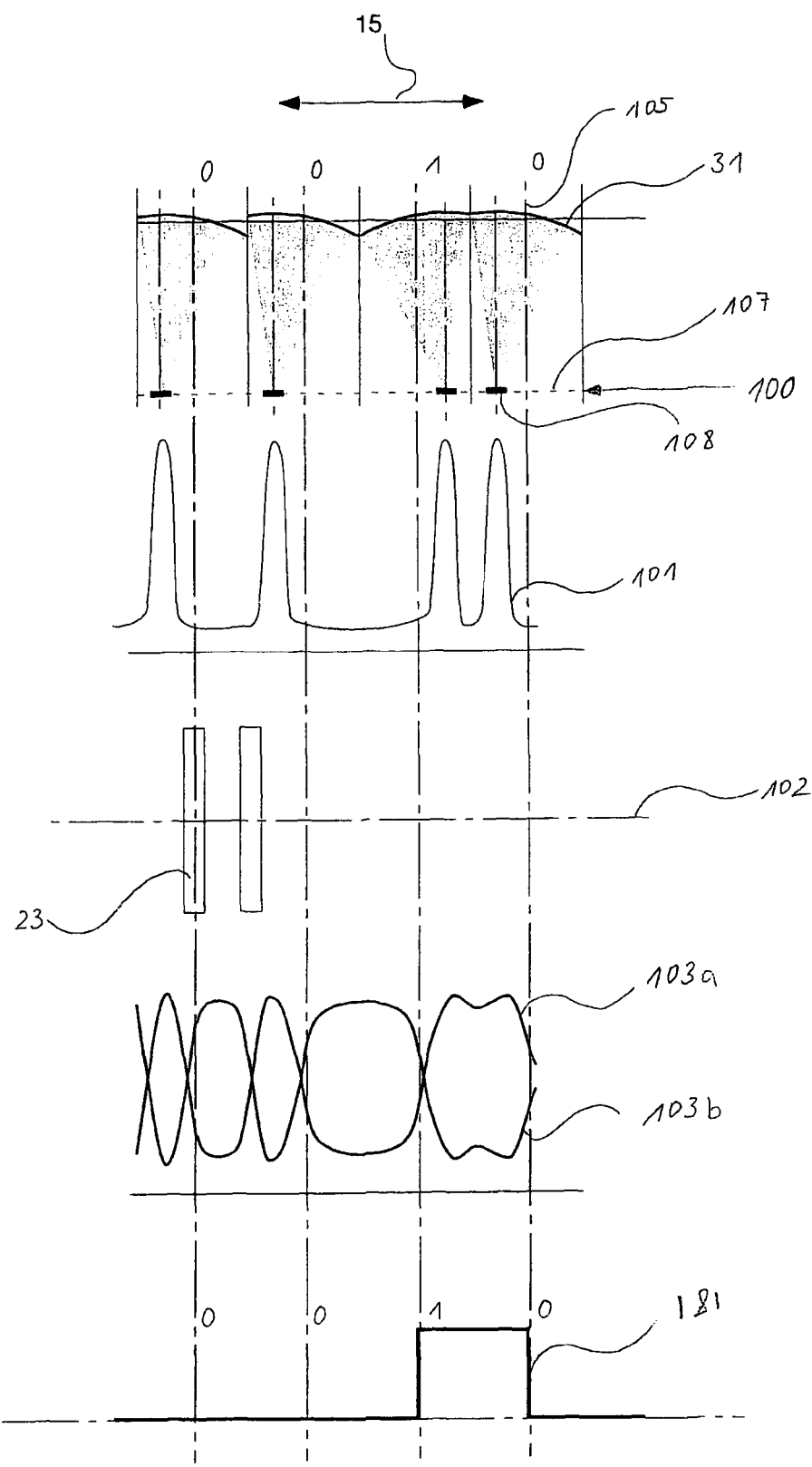
FIG. 9 schematically, the production of a position signal by means of two different optical elements, which are concatenated according to a Manchester code, and two receiver elements.

FIGS. 7, 8 and 9 show various embodiments of material measures 25/31 and light receiver elements 23, which serve for forming at least one analogue signal 103. The analogue signals 103a and 103b are processed in a decoding circuit and optionally converted into a digital signal 104 that can be processed further. The output signals from the decoding circuit serve for determining the position of the material measure relative to the sensor head. The position data can be evaluated by means of an analogue or digital signal.

FIG. 7 shows an incremental track, FIG. 8 shows the track for forming an index, which is evaluated at least once per revolution, and FIG. 9 shows another track structure, which is encoded according to the Manchester code, which together with the incremental signal can define an absolute position. The three tracks mentioned can form, alone or in combination, the material measure, which can be integrated on a carrier, for example a rotary encoder, and is made in the same operation as the carrier. The material measure is formed with two tracks, wherein the optical elements of both tracks have the same focal length.

The track 25 of the material measure shown in FIG. 7 consists of identical optical elements, which are arranged at regular distances from one another in the direction of motion 15 (incremental track). These are oriented the same or parallel relative to the principal direction of the light reflected from them. In FIG. 7, the optical elements are semicircular-cylindrical reflectors, which represent the embodiment in the context of the present invention. The light emitted from the light source is bundled by an optical element of the material measure and is focused on the plane of the sensor 100. There, the light is incident at a point 108. However, little or no light is incident on the adjacent region 107 of the plane of the sensor. The distribution of the light intensity on the plane of the sensor is represented by curve 101. Point 101h of the curve corresponds to a high energy density, and point 101t corresponds to a low energy density. The electrical conversion of the light intensity into an electrical signal takes place with at least two light receiver elements 23, which are arranged with 180° mutual displacement. This means that always when one light receiver element registers a maximum, the other light receiver element registers a minimum, and vice versa. With the two light receiver elements, two analogue signals 103A+ and 103A− are produced, which are sent to the decoding circuit for further processing. The decoding circuit can then form a digital signal 104 from the analogue signals 103.

FIG. 8 shows the index track 31 of a material measure consisting of a single reflector, roughly semicircular-cylindrical in cross-section, which is centred about the axes 105. The width of this reflector will be between 100% and 300% of the width of a reflector of the incremental track. On the plane of the sensor 100, the light is bundled essentially at a point 108, wherein only very little light is incident on the adjoining region 107. An essentially constant and unmodulated amount of light is incident on the remaining region 109. The distribution of the light intensity on the plane of the sensor 100 is represented by curve 101, wherein point 101h corresponds to a high energy density and point 101t corresponds to a low energy density. The conversion of the light intensity into an electrical signal takes place with a special arrangement of light receiver elements 23. According to an embodiment the light receiver elements 23 consist of a main receiver 23Z+ and two receivers 23Z−, which are arranged symmetrically to the main receiver 23Z+ and are connected together electrically. Advantageously, the total area of the light receiver 23Z− is at least 10%, at least 20% or at least 30% greater than the total area of the main receiver 23Z+. This is important in connection with the evaluation of the signals. Because the area contents of the two light receiver elements Z+/Z− are different, it can be ensured that signal 103a is well away from signal 103b, so that they can never cross in the remaining region 109. With this light receiver arrangement, two analogue signals 103a and 103b are produced, which are processed further in the decoding circuit. The signals can for example be compared in a comparator circuit, wherein a point of intersection of the two signals produces in each case a change of the digital level, i.e. one of the flanks of the pulse Zb (cf. digital signal 104).

For forming a stable digital pulse 104 it is important that the two signals 103a and 103b intersect with a large slope. This is achieved with the special arrangement of the light receiver elements 23: In the central position according to FIG. 8 the bundled light beam is mainly incident on the middle receiver element 23Z+, so that the signal peak 103aa is formed. So that the signal level 103ba is as low as possible, the two light receivers Z− should, for example at point 107, receive less light than normally, i.e. than when the light beam is not modulated. This is achieved because the obliquely positioned light receiver elements formed on the upper part, i.e. at the proximal end, are somewhat wider than at the distal end. The configuration of the receivers 23Z+,23Z− shown, with a first oblong light receiver element 23Z+ and two second oblong light receiver elements 23Z−, which are arranged essentially with mirror-image symmetry and at an angle to the longitudinal axis of the first receiver element 23Z+, can be regarded as optimum. With this form of the light receiver elements, signals 103a and 103b can be formed that have a large slope at the points of mutual intersection, so that a reliable basic signal Zb can be formed for the index signal.

The light receiver elements Z− ("Z minus") are arranged obliquely relative to the light receiver element Z+ ("Z plus"). At their ends opposite the light receiver element Z+, the light receiver elements Z− have a width that is much smaller than the width at their ends facing the light receiver element Z+. This optimum arrangement means that during the motion of the index lens (optical element on the material measure) in the direction 15, regions of medium, low and high light intensity are moved over the sensor zone. The form of the light receiver elements Z− means that the variation in light intensity does not affect the signal to the same extent at every position of the index lens relative to the sensor zone. In the edge region, i.e. where the narrow end of the light receiver element Z− detects, the light intensity has a less pronounced effect on the signal than in the central region, i.e. at the site of the light receiver element Z+ and where the wider end of the light receiver element Z− is. Another factor is the distance from the light source. The narrow ends of the light receiver elements Z− are farther from the light source and so receive a lower light intensity.

The geometric centre of gravity 102b of the two light receiver elements 23Z+ and 23Z− coincides as far as possible at the same point. If the centres of gravity do not coincide, i.e. if they are some distance apart, then the level ratio between the two signals 103a and 103b changes when the distance between the material measure 13 and the substrate 19 changes (see FIG. 1). Owing to the advantageous geometry of the receiver elements 23 described, the distance between material measure and sensor head can vary over a relatively wide range, without adversely affecting the signal quality, so that the rather large tolerance in the axial position of shafts of small motors can be taken up without any problem. This also has the advantage that expensive adjustments are not required.

FIG. 9 shows a track 31 of the material measure (absolute track). The track contains, like the incremental track shown in FIG. 7, a large number of optical elements, but here, the optical elements are not all aligned identically or regularly or (relative to their optical axis) not all parallel. Each of the optical elements is configured and/or arranged so that it focuses the light either onto a first or a second point on the plane of the sensor. The two points represent the 0 (zero) or the 1 (one) of a binary code. The sequence of zeroes and ones (binary digits) defines a code, e.g. an 8-bit code, in which 8 successive binary digits define a characteristic position number, which occurs only once on the material measure or over the length of the material measure. In the present example, one point is to the left of the axis 105 and the other is to the right of it. It is, however, also possible to provide three or more different points, i.e. arrange and/or configure the optical elements correspondingly, so that the sequence of the differently positioned points of incidence 108 on the plane of the sensor 100 for example forms a ternary code. However, a binary code such as a so-called Manchester code may be used. On the plane of the sensor 100, the light is bundled at a point 108, which is in each case arranged asymmetrically to the axis 105. Only a small amount of light then falls on region 107. The distribution of the light intensity on the plane of the sensor is shown by curve 101. The electrical conversion of the light intensity into an electrical signal takes place with at least two light receiver elements 23, arranged mutually displaced by 180 degrees. With the light receiver elements 23, two analogue signals 103a and 103b are produced, which are fed together with an incremental signal to a decoding circuit. The decoding circuit will, with the aid of the incremental signal, evaluate the signals 103, so that the bit value of the division is determined and is outputted in a digital signal.

Advantageously, two channels (A and B) and, per channel, two light receiver elements 23 as described above, are provided. It should be noted that in FIGS. 7 and 9, for clarity, only the light receiver elements 23 for one channel (A or B) are shown in each case.

For a given direction of motion or rotation of the material measure according to 15, the bit value is read on each rising or each falling flank of the two incremental signals, on every fourth flank of both incremental signals (from channels A and/or B), by reading the difference between signal 103a and 103b at this time point. At this time point, the level of the digital signal 181 is adjusted according to the bit value or the bit value is outputted in some other way. It can also be envisaged that the reading of the bit value in a direction of rotation or direction of motion of the material measure takes place for example with falling flank of channel A and with rotation or movement in the opposite direction with rising flank of channel A.

The two incremental signals form 4 flanks per division (two analogue signals 103a/103b per channel A/B). Which of these flanks is used for evaluating the bit value depends ultimately on the placement of the sensor head within the permissible tolerance field relative to a rotation about the angle 41 (cf. FIG. 1). The angular error can be corrected with the circuit shown in FIG. 13*d*.

As mentioned above, the order of the bit values of the material measure is selected in such a way that with a particular number of successive bits, a particular order can only be found once over the length of the material measure. The order is formed according to Manchester code.

Figure 10:
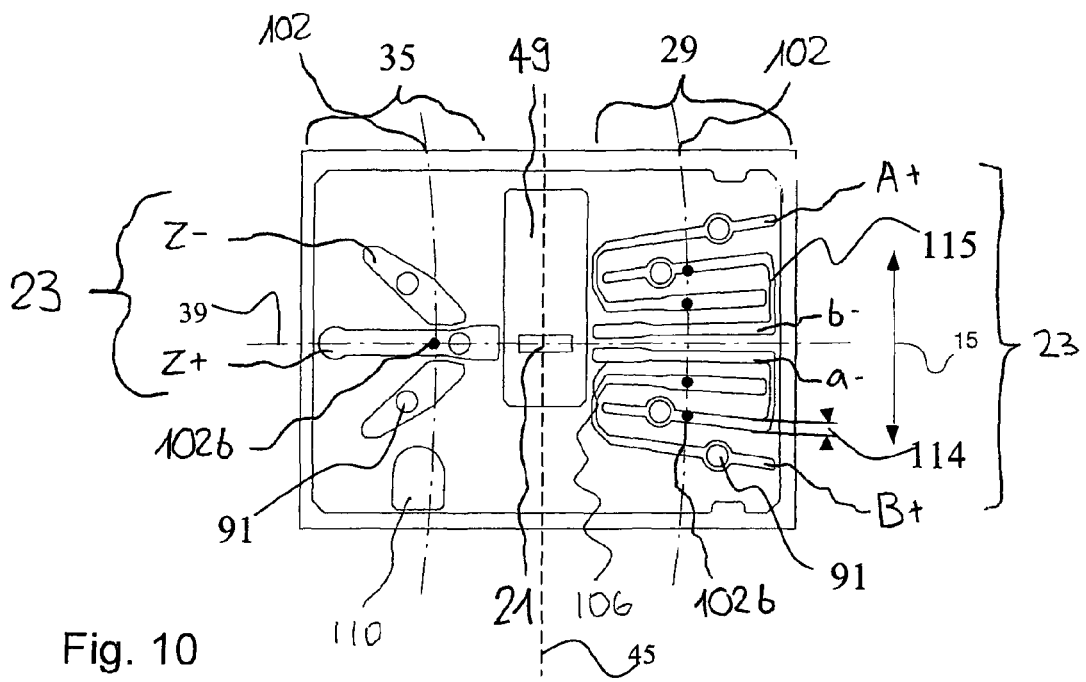
FIG. 10 a top view of a first exemplary embodiment of a sensor head according to the invention with a plurality of receiver elements with an incremental and an index track.

FIG. 10 shows an arrangement of the light receiver elements 23 for a 3-channel encoder (channel A, channel B, channel Z or index), wherein the principal axis 45 of the emitted light beam passing through the centre of the light source coincides with the centre line 43 of the material measure (FIGS. 1, 2) (see FIG. 1). The light receiver elements for the incremental signal are arranged in the sensor zone 29 (which interacts with the first track 25 of the material measure) and those for the index signal are arranged in sensor zone 35 (which interacts with the second track 31 of the material measure). At the contact point or openings 91 (see also FIGS. 3*d* and 3*e*) the "stud-bumps" can be arranged on the uppermost metal layer (cf. 51 in FIG. 3*a*), e.g. by ultrasonic welding. These points can be covered with a layer of gold, so that when using a conducting adhesive, the adhesiveness is not impaired by an oxide layer. The same sensor head could also be used for an absolute encoder with Manchester code, wherein region 25 then remains unchanged and at least two receiver elements (as shown for example in FIG. 9) are arranged in region 31.

So that the encoder is not sensitive to assembly tolerances (i.e. with respect to the centring of the light source and the angular position of the sensor head relative to the principal axis 43 (cf. FIG. 1) of the material measure), the following order of the light receiver elements relative to the direction of motion 15 is selected: A+/B−/A−/B+ or A−/B+/A+/B−, i.e. with reference to the two channels A and B, a symmetrical arrangement of the light receiver elements relative to the axis 39. In this case the light receiver elements A+,A− and B−,B+ are in each case offset by 180 degrees. In this way, both for channel A and for channel B, two sinusoidal curves, mutually displaced by 180 degrees, are obtained, which can be converted in a comparator circuit into a digital signal. In this arrangement, the contact points and the linkage between the light receiver elements 23 are formed in the same or from the same material as the light receiver elements, i.e. these regions are also optoelectronically active. It is then necessary to bear in mind that the centre of gravity of each of the 4 light receiver elements in the sensor zone 29 is essentially at the same distance from the light source 21 (see line 102). Here, the points 102*b* mark in each case the centre of gravity of a U-shaped receiver element. In direction 15, the distances between the centres of gravity 102*b* should essentially coincide with the division of the material measure. The normal width 114 of a light receiver in sensor zone 29 is selected between 40 and 80% of the width of a division of the material measure. Width is to be understood, in this context, as that dimension of the light receiver elements or of the light source that runs parallel to the principal axis 45. In order to obtain the centre of gravity of an array of light receiver elements in the correct place, it is generally necessary to make the width of the receiver elements wider at certain places 106, or adjust the width. This is because the transition lines 115 within the light receiver elements and the areas around the contact points or openings 91 also detect light, i.e. inevitably increase the areas of the light receiver elements. This has a negative influence on the position of the centres of gravity 102*b* of the light receiver elements and the signal produced. The reference number 110 shows the contacts to the TCO layer.

Advantageously, the width of the light source 21 or of the diaphragm 49 is selected between 60 and 150%, or 100% to 120% of the width of a division. If the width of the diaphragm 49 is too small, too little luminous energy is allowed through. If the width of the diaphragm 49 is too large, the width of the light spot will be too large, so that the signals become too flat to be evaluated reliably.

An identical arrangement of the light source and of the optical receiver elements could be achieved with other technologies, if for example the light source 21 were to be constructed as a light-emitting OLED on the substrate 19, and the sensor zones 35 and 29 were to have a similar layer structure as the OLED. Both OLED and the light receiver elements then consist of thin layers, as shown in FIG. 3*a*, but different starting materials could be used.

Figure 11:
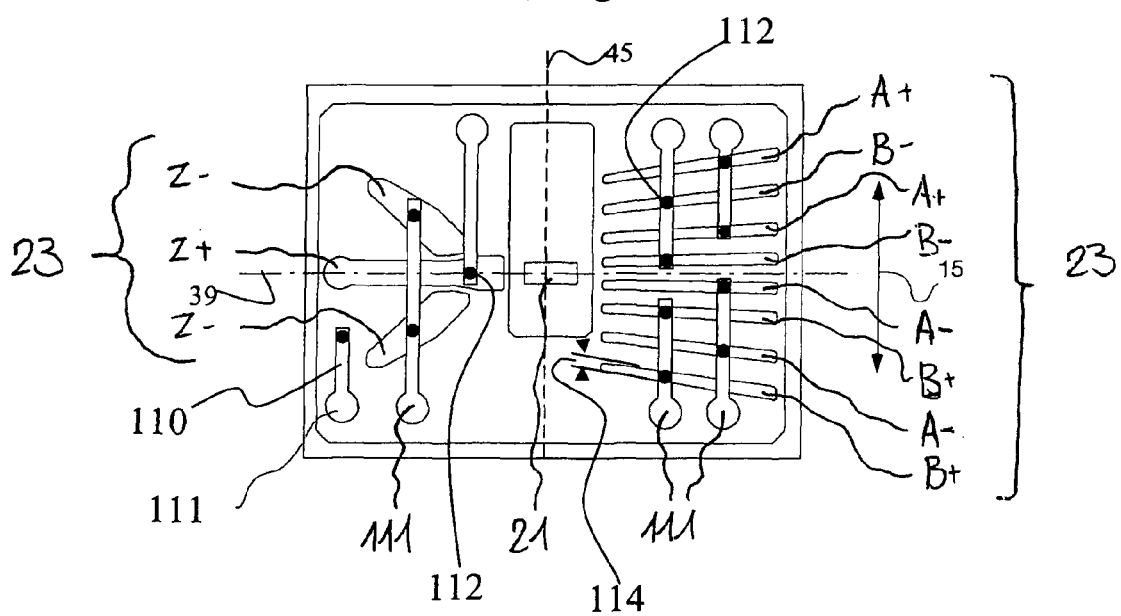
FIG. 11 a top view of a second exemplary embodiment of a sensor head according to the invention, in which the receiver elements are electrically connected by means of a separate circuit-board conductor.

FIG. 11 shows another arrangement of light receiver elements, wherein the individual receiver elements are connected electrically by VIAs 112 ("vertical interconnect access") through the passivation layer (e.g. an $SiO_2$ layer or an $SiO_2/Si_3N_4$ layer structure) with conducting tracks, such as of aluminium, applied on the passivation layer. The advantage of this arrangement is that the light receiver elements 23 are optimally configured, without the transition lines 115 and/or contact points 91 being able to influence the formation of the analogue signals, or without the need for corrections of the width 114. At the end of the conducting tracks there are the pads 111, on which the "stud-bumps" are applied. Such a solution will cost more, because additional layers must be provided and additional precautions must be taken. An arrangement of the receiver elements 23 in the direction of motion 15 has the same advantages as given above in the description of FIG. 10. Connection to the TCO layer can also be made by means of the conducting tracks and a VIA 112, wherein once again pads 111 can be arranged at the end of the conducting tracks for reliable application of a stud-bump.

FIG. 12 shows a design of the light source consisting of diaphragm and LED (also see FIG. 2). The LED is, as described in FIG. 4*c*, glued on the substrate 19 (e.g., glass), or on the uppermost metal layer (cf. FIG. 3, 51), and radiates through the light opening 49 that was made in the thin-film structure. The LED 21 is housed in recess 71 (cf. FIG. 2) of the supporting plate 17 (cf. FIG. 2). Several variants of how the light source can be mounted on the substrate 19 are shown. FIG. 12*a* shows the light source with an emission layer 161 and a contact layer 163. Between the light source 21 and the coated glass substrate 19, a spacer 75 is provided, which keeps the light source at a distance from the substrate 19. It can be seen that with this design there is the risk that light emerging laterally 165 will impinge on the light receiver, i.e. this arrangement is disadvantageous because the scattered light produced can penetrate into the light sensor zone, which can lead to deviations from the desired signal quality. The reference number 170 shows the cone of light emitted from the light source towards the material measure.

FIG. 12*b* shows an isolated light source, in which the emission layer 161 is edge-coated with a non-transparent covering layer 167. This can prevent scattered light impinging on the light receiver. According to FIG. 12*c*, the non-transparent covering layer 167 is not applied on the light source 21 but on the light receiver. This covering layer serves in the example also as contact 163 to the LED. Further precautions may consist of selecting, as "underfill", a material that is opaque or has low transmission for light.

FIG. 13*d* shows a circuit with which assembly errors with respect to the angular position 41 (cf. FIG. 1) of the sensor head relative to the principal axis of the material measure can be compensated, so that the index signal can function reliably regardless of said angular error. As described above, selection of the flank of the incremental signal for determining the bit value (in connection with an absolute track) depends on the placement of the sensor head or on the rotation thereof by the angle 41. The circuit can therefore be used for determining these flanks.

FIG. 13a shows the signals A, B, Zb and Z. Signal Z is formed by combining signals A and B and Zb. A and B each correspond to a digital signal 181 (cf. FIG. 9; only signal for one channel shown), wherein signal A originates from channel A and signal B from channel B. The signal Z depicted in said FIG. 13a consists of two pulses, which basically is undesirable. By recombining the original signals A and B, in FIG. 13b other signal states Aout (or Ao) and Bout (or Bo) are produced, wherein the signal Zb is almost centred on the region of the signals A and B in plus. The resulting signal Z therefore consists of a single pulse.

The conversion (recombination) of the original signals A (or Ain) and B (Bin) into the effective output signals Aout and Bout is effected using the control signals X1 and X2, e.g. according to the combination table in FIG. 13c, wherein the original signals A and B are inverted and/or interchanged.

The two channels A and B in FIG. 13b consist for channel A of the inverted input channel B and for channel B of the input channel A. Therefore combining the signals from channel Aout and channel Bout and channel Zb forms an index signal Z with a single pulse. Further signal combinations are shown in the truth table 13c.

Signal processing according to the truth table can take place by the circuit illustrated (FIG. 13d). The circuit is controlled by two control signals X1 and X2. The signals Ain 200 and Bin 201 are inverted by two inverters 206, 207. The circuit additionally contains 4 mutliplexers 208, which depending on the state of the control signals X1, X2 relay one of the two signals in the input to the respective output. In the examples presented in FIGS. 13a and 13b, the control signals are set at X1=0 and X2=1, where the travels are shown with thicker lines in FIG. 13d. The control signals X1 and X2 are produced in the decoding circuit. The decoding circuit is designed so that various settings or values for the control signals can be programmed in, which can take place during final product inspection.

Figure 14:
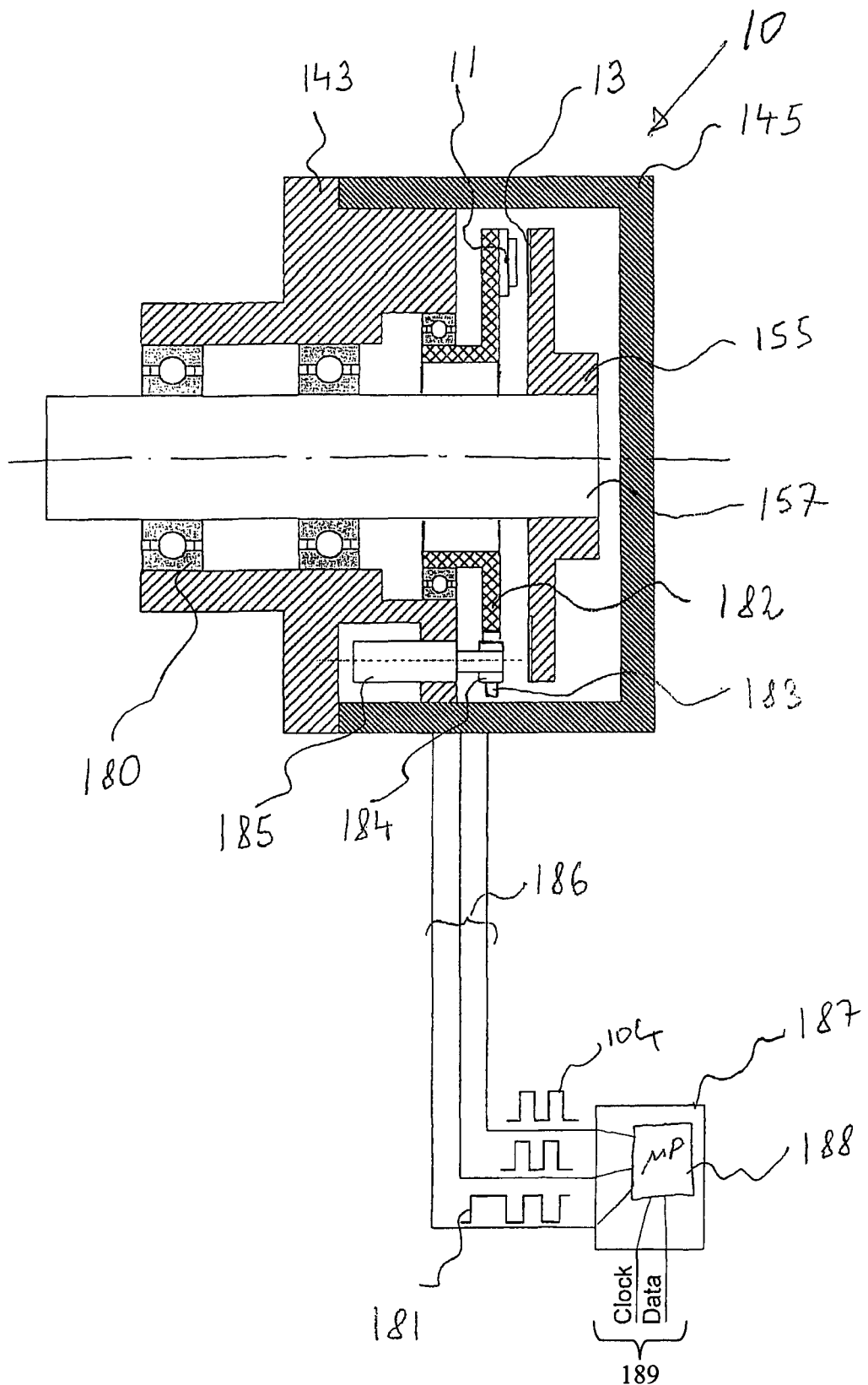
FIG. 14 a exemplary embodiment of an absolute encoder with cold-start position determination.

In FIG. 14, a special design of an absolute encoder is shown schematically, which can determine an absolute position signal even with stationary sensor head 11 or stationary shaft 157, or in cold start. This is made possible by a special device, which allows relative movement between material measure and sensor head. The device has a swivel arm 182 (or an equivalent device), on which the at least one sensor head is secured. The swivel arm is driven by a motor, and produces a relative movement between material measure 13 and sensor head 11, which corresponds to a fraction, less than 5 degrees, of a complete revolution. The absolute position can be determined by evaluating the signals coming from the sensor head 11. Once again, this is possible owing to the compact design of the sensor head and the tolerance-friendly design of this arrangement.

FIG. 14 shows the schematic construction of the absolute encoder with a housing 143, 145, a mounted shaft 157, a rotary encoder 155 with a material measure 13 with an absolute track according to FIG. 9 and an incremental track according to FIG. 7, a carrier 182 that is fixed or can be swivelled through a small angle, on which at least one sensor head 11 is applied. The rotary encoder 155 is secured centrally on a shaft 157, said shaft in a housing 143 having a keyed connection with at least one bearing 180.

With a small movement of the axis or a movement of the rotary encoder of less than 3 degrees, a position number can be determined, with which an (absolute) position value of the rotary encoder can be determined. Then the position value can be determined either by addition/subtraction of the pulses from the incremental track or by determining further position numbers. Redundant acquisition of the position values can easily be achieved by combining the two variants.

The Manchester code is read with one or more pairs of receiver elements (see FIG. 9). A position number is determined between 1 and a maximum number of position numbers by a movement of the material measure relative to the sensor head. The length of the position number, expressed in binary form, is the number of bits, which is determined by the length of the material measure. The position number is determined by reading a number of successive bits. A position number is defined by the material measure formed according to the Manchester code. On the entire length of the material measure, the position numbers are singular, i.e. determine in each case the position of the material measure relative to the light receivers. The position number read is converted into a position value by means of the decoding circuit. The position number is transferred by means of digital signals 181 and converted by a conversion circuit 187 into a position value. The conversion circuit 187 can be integrated in the decoding circuit 47 (also see FIG. 2).

Redundant determination of the position values can protect against reading errors, by recording several successive position numbers. This means that in fact a "lengthened" position number is recorded. The lengthened position number is converted into several position values. If the position values cannot be arranged in a row, it could be concluded that there is a reading error of the Manchester code.

FIG. 14 shows an arrangement in which the conversion circuit 187 is arranged outside of the sensor. The conversion circuit 187 is connected by 3 lines 186 to the encoder, or its decoding circuit (schematic representation). Two lines transmit the pulses from channels A and B (digital signal 104) and the third line transmits a digital signal 181, which forms the position numbers of the absolute track. In this way, position information is transmitted redundantly between encoder 10 and conversion circuit 187. This ensures reliable transmission of the position numbers and determination of the position values. The conversion circuit 187 transmits, by means of a conventional data bus 189, e.g. SPI, I2C, Profibus etc., the data for example further to an SPS control system. The conversion circuit 187 comprises a microprocessor 188, which performs translation of the position numbers into position values. Translation of the position number into a position value can take place in two different ways:

a) a Manchester code generator forms position numbers successively; when one of the position numbers from the material measure to be translated coincides with the generated position number, the position number of the generator is outputted as position value, b) in the microprocessor, a table is provided, which contains position values, wherein each storage location in the table or each position value is associated with a particular position number, so that position numbers can be assigned to particular position values.

A disadvantage of conventional encoder systems with Manchester code is that for determining the absolute position, a relative movement of the material measure, and therefore a movement of the machine components to be measured, is necessary, in order to determine the absolute position values. This is not appreciated by the machine builder.

It is desirable to be able to determine a position value on switching on the machines, before any movements take place. This is solved in that the rotary encoder has a large number of tracks, with at least one receiver element assigned to each track. The circuit required for this is complex and such a multi-track arrangement takes up a lot of space, so that position measuring devices of this kind do not fit into small housings.

In another embodiment of the invention, means are provided that allow movement of the sensor head relative to the material measure internally in the sensor, so that determination of the position value becomes possible by pressing a button, without having to set the machine in motion. This is achieved by turning the sensor head or the carrier (e.g. a swivel arm 182) on which the sensor head is arranged, through approx. 3°. This can for example take place with a motor 185 and a cam 184, which engages as a keyed connection in a slot 183 of the swivel arm 182. Instead of a motor with lever and cam, actuators of a different kind can be used. The signals produced by this movement (channel A, channel B and M-code) can then be used for determining the position values.

Figure 15:
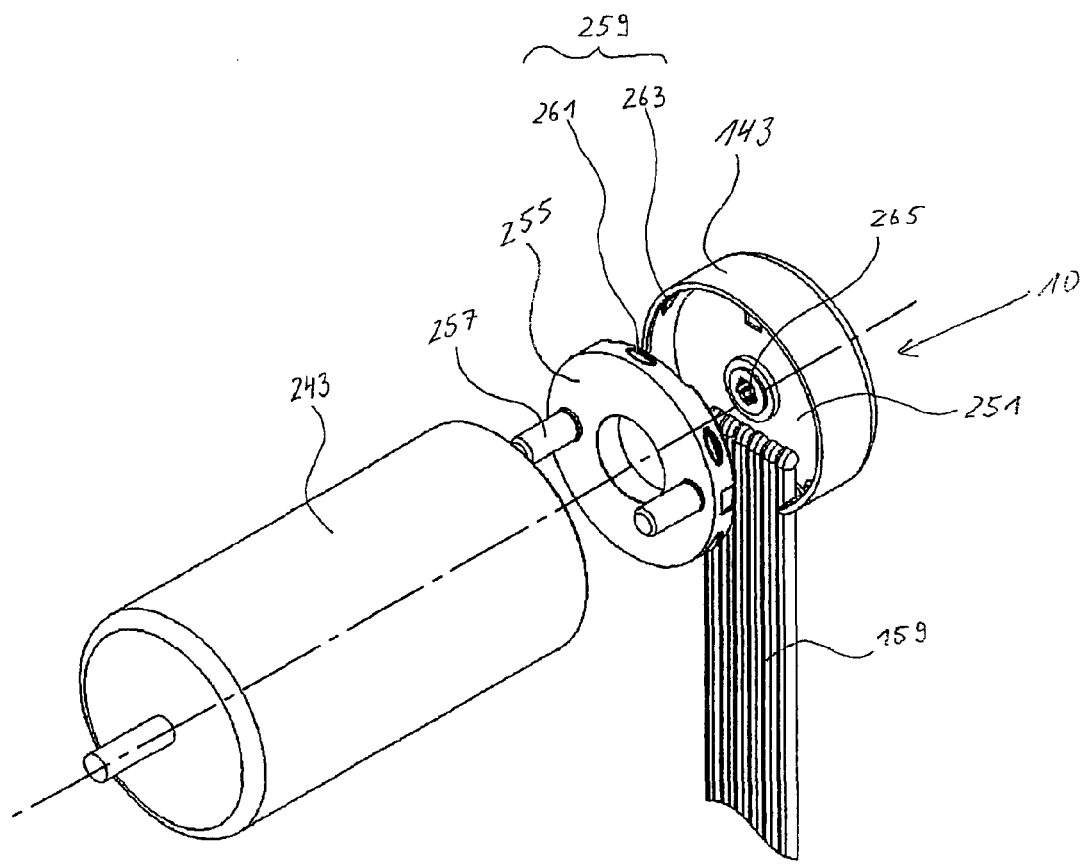
FIG. 15 a perspective view of a kit encoder with motor.
Figure 16:
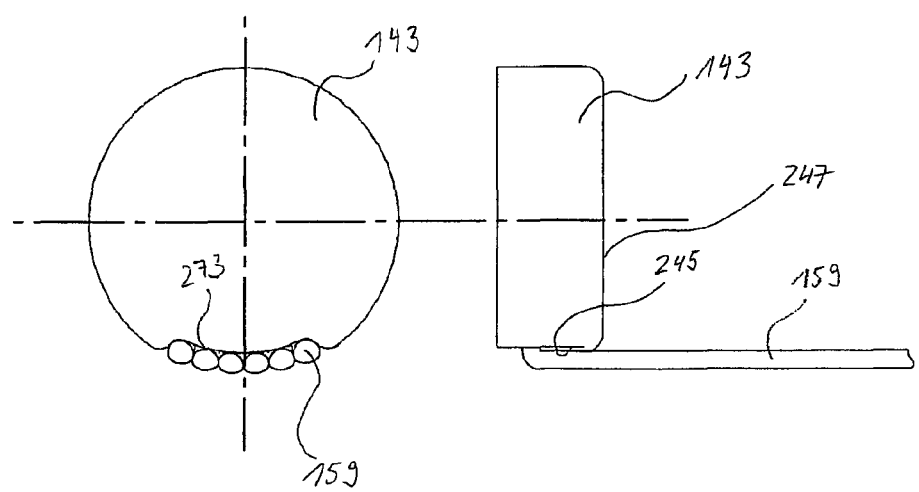
FIG. 16 a rear and side view of the housing with horizontal cable.
Figure 17:
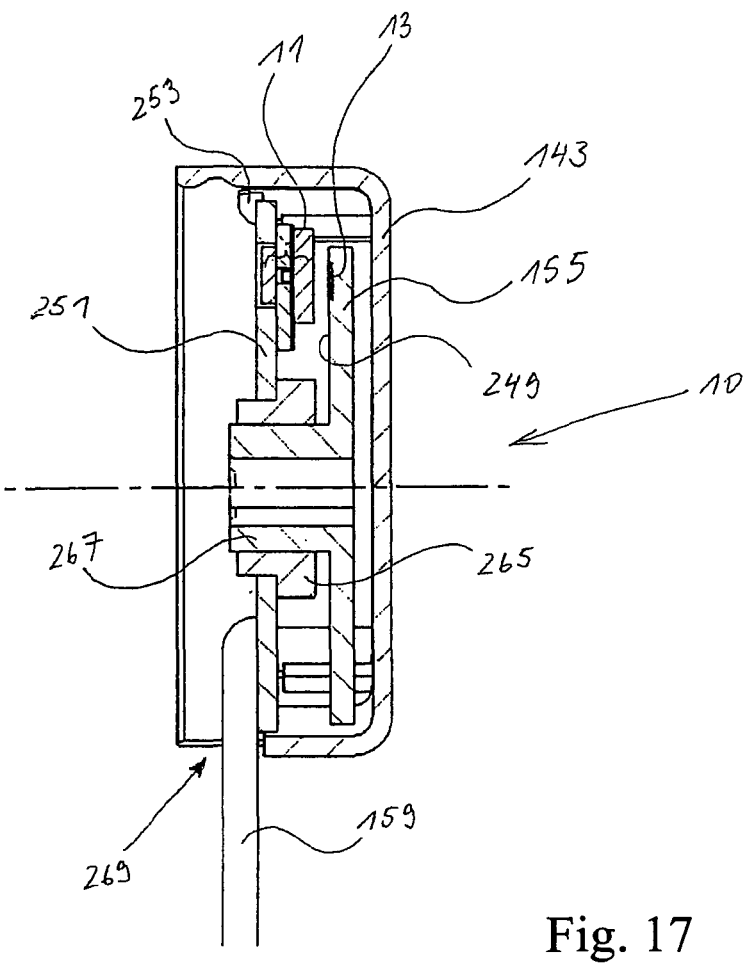
FIG. 17 a sectional view of the housing of the kit encoder

FIGS. 15 to 17 show a position measuring device. This is a kit encoder 10, which is of an especially compact design. This design is characterised by a particular arrangement of the rotary encoder 155, of the material measure 13 applied thereon, of the housing 143 and of the sensor head 11, which interacts with the material measure 13 to produce a signal. The material measure 13 is in this case located on the side 249 of the rotary encoder 155 that is opposite the housing 143. This means a part of the housing 143 extending next to, along or essentially parallel to the flat side of the rotary encoder 155 and/or the upper part of the housing 143. Thus, the rotary encoder 155 is arranged between the inside of the housing 143 (or the inside of the aforesaid part of the housing) and the sensor head 11 or the printed-circuit board 251. Based on the fact that the support 267 for the shaft (or at least the larger part, especially at least 70 or 90% of the length of the shaft support) is arranged on the same side of the rotary encoder 155 as the material measure 13, there is a considerable saving of space. The reason for this is that the place of measurement, i.e. the region between material measure 13 and sensor head 11, is arranged next to the shaft or the shaft support 267. During assembly of the rotary encoder 155 in the housing 143, the position of the rotary encoder 155 relative to the aforementioned part of the housing 143 parallel to it, or the distance between the inside of the housing 143 and the rotary encoder 155, are established by pressing in or deforming the aforesaid parallel part of the housing 143, and releasing it again after installing the rotary encoder 155. To make this easier, the material of the housing 143 on the aforesaid part that runs parallel to the rotary encoder 155 can be thinner or more elastic than the adjacent parts. Advantageously, the sensor head 11 is mounted on a printed-circuit board 251, which has a keyed connection with the housing 143. The printed-circuit board 251 can also be designed to assume the function of the supporting plate.

This takes place by means of a snap connection 153. Very simple assembly of the encoder 10 can be achieved by using an adapter part 255, which has a first fastener 257 and a second fastener 259. The first fastener 257 serves for securing the adapter part 255 relative to the shaft centrally on the motor 243 and can for example consist of screws. The second fastener 259 is advantageously a snap connection 259, which is formed for example by one or more projections 261 and one or more recesses 263. Projections 261 and recesses 263 can be arranged on the housing (especially on the inside wall of the housing) and/or on the adapter part 255. It is a detachable connection. Advantageously, the housing 143 has an assembly bearing 265, for receiving the rotary encoder 155 and/or a support 267 for a shaft that is connected to the rotary encoder 155. This is because the rotary encoder 155 and the shaft support 267 can be formed either as one piece or can also be individual parts that are connected together. The assembly bearing 265 has the function of keeping the rotary encoder central to the housing during the assembly operation. The bearing itself can be a ball bearing or a sliding bearing made of Teflon, wherein the sliding bearing may be used as the rotation of the motor shaft is not loaded by such a bearing.

The function of the assembly bearing is to ensure accurate alignment of the rotary encoder and of the sensor head (cf. axis 22 in FIG. 1). The bearing material Teflon has the advantage of a low coefficient of friction and especially pronounced creep behaviour, so that the bearing function in the assembled state is lost over time. This is desirable as the assembly bearing should lose its bearing function after assembly, so that the existing bearing system is not subject to any additional disadvantageous loading. It is also possible to use a rigid bearing (e.g. ball bearing), which is, however, advantageously connected elastically to the printed-circuit board 251.

The radius of the rotary encoder 155 is smaller than the radius of the printed-circuit board 251. If the outer edge of the sensor head 11 relative to the rotation axis of the rotary encoder 155 is further outside than the outer edge of the rotary encoder 155, the rotary encoder 155 can be of smaller design and space is left e.g. for the cables mentioned below or the recess 273. In the encoder 10 according to the invention, the housing 143 and/or the printed-circuit board 251 and/or the rotary encoder 155 and/or the fasteners 253 and/or 259 are made of plastic. An especially compact design is achieved, moreover, when the contacting of the sensor head 11 takes place via a lateral opening 269 in the housing 143. This opening 269 is arranged advantageously on the side of the sensor head 11 and/or of the printed-circuit board 251 opposite the rotary encoder 155. Thus, the contacting can take place on the underside of the sensor head 11 or—when the sensor head 11 is contacted via the printed-circuit board 251—on the underside of the printed-circuit board 251. The aforesaid contacting can be effected by means of one or more cables 159, which enter the housing 143 through the opening 269. Advantageously, it is a ribbon cable 159 as shown in the diagrams, wherein a Flexprint can also be used. The opening 269 is therefore advantageously of oblong shape and is arranged essentially parallel to the rotary encoder 155 and/or to the printed-circuit board 251. The ribbon cable 159 is also correspondingly oriented. If the housing 143 has, on a side 245, a recess 273 adjoining the opening, this is especially advantageous. Especially when the recess runs from the opening along the side 245 of the housing 143 up to another side 247 or up to a rim of the housing 143 or up to an edge of the housing 143. The recess 273 can run from the opening 269 e.g. up to the top 245 of the housing 143. The cable 159 can thus be positioned in the recess 273. If the housing 143 is of a cylindrical shape, the cable 159 is thus within the cylinder radius. Furthermore, it is advantageous if the position measuring device, or the encoder 10 has one or more of the features such as are described in other parts of this document. We may mention in particular the configuration of the sensor head 11 and of the material measure. The material measure has for example at least two tracks, wherein one track is an incremental track and wherein a second track is either an index track or an encoded track, as described in this document.

The parts shown in FIG. 17 together form a component of a device, which can be inspected or tested before shipment from the factory. Together with the fastener 255 (cf. FIG. 15) the aforesaid component of a device forms an assembly kit, which can for example be fitted on a motor without particular expense.

FIG. 18 shows an advantageous connection technology for securing a rotary encoder 155 on a shaft 157. The rotary encoder has a through-hole 272 with a special shape, for example a cylindrical shape with 3 (or more) flat or flattened regions 271. The rotary encoder is arranged centrally on the shaft 157, by inserting the shaft 157 into the through-hole 272. The mounting of a plastic rotary encoder on a metal shaft is not so simple, when the requirements relating to concentricity tolerances and interference fit are considered. An excessive interference fit can lead to breakage of the rotary encoder made of plastic. Moreover, this may not happen until after a certain time period, i.e. for example several months after assembly. The concentricity tolerance directly impairs the quality of the encoder function. This arrangement is advantageous especially for the toolmaker. He can adjust the centring of the parts most accurately by grinding flats on the tool punch. The spaces or channels 275 provide room for adhesive, which in combination with a very easy interference fit can avoid the risk of cracking and ensures a reliable connection of the two parts.

The invention claimed is:

1. A position measuring device, comprising:
   at least one material measure comprising an optical structure comprised of a plurality of focusing optical elements, the plurality of focusing optical elements arranged in a first track and a second track;
   a plurality of light receivers arranged at a distance from the at least one material measure, the plurality of light receivers forming at least one first sensor zone and at least one second sensor zone, wherein the first sensor zone is configured to interact with the plurality of focusing optical elements of the first track for producing an incremental signal and wherein the second sensor zone is configured to interact with at least one focusing optical element of the second track for producing an index signal;
   a light source arranged at a distance from the material measure and from the plurality of light receivers;
   at least one transparent substrate between the material measure and the plurality of light receivers, wherein the plurality of light receivers are disposed on a side of the transparent substrate opposite the material measure in the form of a thin-film structure comprising a plurality of layers arranged one above another; and
   a supporting plate comprising a plurality of circuit-board conductors, the transparent substrate and the supporting plate joined together by a Flip-Chip assembly process.

2. The position measuring device of claim 1, wherein the light source and the plurality of light receivers comprise a sensor head and wherein the material measure is movable relative to the sensor head.

3. The position measuring device of claim 2, wherein the material measure is mounted on a movable element, the sensor head is arranged on a carrier, and the sensor head is displaceable relative to the movable element when the movable element is in a resting position.

4. The position measuring device of claim 2, further comprising a motor mechanically linked to the sensor head for displacing the sensor head.

5. The position measuring device of claim 3, wherein the carrier is configured to swivel for displacing the sensor head.

6. The position measuring device of claim 3, wherein the carrier is rotatable about a swivel point.

7. The position measuring device of claim 6, wherein the carrier is rotatable about the swivel point by an angle of less than 5 degrees.

8. The position measuring device of claim 1, wherein the second sensor zone has at least one first and one second light receiver element, wherein the first light receiver element is configured for production of a first signal and the second light receiver element is configured for production of a second signal.

9. A method for determining the absolute position of a moving element in a position at rest, comprising:
   using a position measuring device comprising a sensor head and a material measure, the material measure being coupled to a movable element and being movable relative to the sensor head, wherein the sensor head comprises:
      a plurality of light receiver elements forming at least one first sensor zone and at least one second sensor zone at a distance from the material measure;
      a light source spaced from the material measure and from the plurality of light receiver elements; and
      at least one transparent substrate between the material measure and the plurality of light receiver elements, wherein the plurality of light receiver elements are positioned on a side of the transparent substrate opposite the material measure and are in the form of a thin-film structure comprising a plurality of layers arranged one above another; and
      a supporting plate comprising a plurality of circuit-board conductors, the transparent substrate and the supporting plate joined together by a Flip-Chip assembly process, and
   wherein the material measure comprises a first track having a plurality of focusing optical elements and a second track having at least one focusing optical element, wherein the first sensor zone is positioned to interact with the first track for producing an incremental position signal and wherein the second sensor zone is positioned to interact with a second track for producing an index signal; and
   determining the absolute position of the movable element in a resting position with the position measuring device by displacing the sensor head relative to the movable element.

10. The method of claim 9, further comprising using the first track as an incremental track, and a second track as a coded absolute track.

11. The method of claim 10, further comprising using at least two light receiver elements of the sensor head to interact with the coded absolute track of the material measure, wherein a first light receiver element produces a first signal and a second light receiver element produces a second signal.

12. The method of claim 9, wherein during the displacing, the sensor head moves along a circular arc.

13. The method of claim 12, further comprising predetermining the absolute position of the movable element in the resting position at a centre-point angle of the circle defined by the circular arc of less than 5 degrees.

* * * * *